US012787783B2

(12) United States Patent
Trindade et al.

(10) Patent No.: US 12,787,783 B2
(45) Date of Patent: Nov. 3, 2026

(54) MICRO-TRANSFER-PRINTABLE COMPONENT MODULES WITH A MODULE TETHER AND MICRO-COMPONENT ON A FLEXIBLE, POLYMER, OR ORGANIC MODULE SUBSTRATE

(71) Applicant: X-Celeprint Limited, Dublin (IE)

(72) Inventors: António José Marques Trindade, Cork (IE); Ronald S. Cok, Rochester, NY (US); Pierluigi Rubino, Cork (IE)

(73) Assignee: X-Celeprint Limited, Dublin (IE)

( * ) Notice: Subject to any disclaimer, the term of this patent is extended or adjusted under 35 U.S.C. 154(b) by 1038 days.

(21) Appl. No.: 17/588,888

(22) Filed: Jan. 31, 2022

(65) Prior Publication Data

US 2022/0285291 A1 Sep. 8, 2022

Related U.S. Application Data

(60) Provisional application No. 63/233,627, filed on Aug. 16, 2021, provisional application No. 63/158,324, filed on Mar. 8, 2021.

(51) Int. Cl.
*H10W 42/00* (2026.01)
*H10P 72/70* (2026.01)
(Continued)

(52) U.S. Cl.
CPC ............. *H10W 42/00* (2026.01); *H10P 72/74* (2026.01); *H10W 74/014* (2026.01);
(Continued)

(58) Field of Classification Search
CPC . H01L 23/564; H01L 21/568; H01L 21/6835; H10W 42/00; H10W 74/019;
(Continued)

(56) References Cited

U.S. PATENT DOCUMENTS 6,383,833 B1 * 5/2002 Silverbrook ........... B41J 2/1626 438/464
7,521,292 B2 4/2009 Rogers et al.
(Continued)

FOREIGN PATENT DOCUMENTS

WO WO-2021/037808 A2 3/2021

OTHER PUBLICATIONS

Cok, R. S. et. al., AMOLED displays with transfer-printed integrated circuits, Journal of SID, 19(4):335-341, (2011).
(Continued)

*Primary Examiner* — Lex H Malsawma
(74) *Attorney, Agent, or Firm* — Choate, Hall & Stewart LLP; Michael D. Schmitt

(57) ABSTRACT

A micro-component module comprises a module substrate, a component disposed on the module substrate, and at least a portion of a module tether in contact with the module substrate. The module substrate can be flexible or can comprise an organic material, or both. The module tether can be more brittle and less flexible than the module substrate. The component can be less flexible than the module substrate and can comprise at least a portion of a component tether. An encapsulation layer can be disposed over the component and module substrate. The component can be disposed in a mechanically neutral stress plane of the micro-component module. A micro-component module system can comprise a micro-component module disposed on a flexible system substrate, for example by micro-transfer printing. A micro-component module can comprise an internal module cavity in the module substrate with internal module tethers physically connecting the module substrate to internal anchors.

21 Claims, 35 Drawing Sheets

(51) Int. Cl.

| | |
|---|---|
| ***H10W 74/01*** | (2026.01) |
| ***H10W 90/00*** | (2026.01) |
| *H10W 70/692* | (2026.01) |
| *H10W 70/695* | (2026.01) |
| *H10W 74/10* | (2026.01) |
| *H10W 90/10* | (2026.01) |
| *H10W 90/22* | (2026.01) |

(52) U.S. Cl.

CPC ......... *H10W 74/019* (2026.01); *H10W 90/00* (2026.01); *H10P 72/744* (2026.01); *H10W 70/692* (2026.01); *H10W 70/695* (2026.01); *H10W 74/114* (2026.01); *H10W 90/10* (2026.01); *H10W 90/22* (2026.01)

(58) Field of Classification Search

CPC . H10W 74/014; H10W 74/114; H10W 90/00; H10W 90/10; H10W 90/22; H10W 70/695; H10W 70/692; H10P 72/74; H10P 72/744

See application file for complete search history.

(56) References Cited

U.S. PATENT DOCUMENTS

| | | | | |
|---|---|---|---|---|
| 7,622,367 | B1 | 11/2009 | Nuzzo et al. | |
| 7,799,699 | B2 | 9/2010 | Nuzzo et al. | |
| 8,506,867 | B2 | 8/2013 | Menard | |
| 8,722,458 | B2 | 5/2014 | Rogers et al. | |
| 8,889,485 | B2 | 11/2014 | Bower | |
| 9,520,537 | B2 | 12/2016 | Bower et al. | |
| 9,997,102 | B2 | 6/2018 | Rotzoll et al. | |
| 10,217,730 | B2 | 2/2019 | Bower et al. | |
| 10,347,535 | B2 | 7/2019 | Bower et al. | |
| 10,505,079 | B2 | 12/2019 | Raymond et al. | |
| 2013/0140655 | A1* | 6/2013 | Yeh ....................... | B81B 7/0061 438/51 |
| 2016/0086855 | A1* | 3/2016 | Bower ................ | H01L 21/6835 257/798 |
| 2016/0093600 | A1 | 3/2016 | Bower et al. | |

OTHER PUBLICATIONS

Hamer et al., 63.2: AMOLED Displays Using Transfer-Printed Integrated Circuits, SID 09 Digest, 40(2):947-950 (2009).

* cited by examiner

MICRO-TRANSFER-PRINTABLE COMPONENT MODULES WITH A MODULE TETHER AND MICRO-COMPONENT ON A FLEXIBLE, POLYMER, OR ORGANIC MODULE SUBSTRATE

PRIORITY APPLICATIONS

This application claims the benefit of U.S. Provisional Patent No. 63/158,324, filed on Mar. 8, 2021, and U.S. Provisional Patent No. 63/233,627, filed on Aug. 16, 2021, the disclosure of each of which is hereby incorporated by reference herein in its entirety.

TECHNICAL FIELD

The present disclosure relates generally to printable modules that include flexible, polymer, or organic module substrates.

BACKGROUND

Substrates with components such as electronically active devices or other structures distributed over the extent of the substrate can be used in a variety of electronic systems. A variety of methods may be used to distribute components over a substrate, including forming the components on the substrate, for example forming thin-film transistors made using photolithographic methods and materials on the substrate, and forming the components on separate wafers using integrated circuit techniques and transferring the components to a substrate, for example using vacuum grippers, pick-and-place tools, or micro-transfer printing.

One exemplary micro-transfer printing method for transferring active devices from a source wafer to a target substrate to another is described in *AMOLED Displays using Transfer-Printed Integrated Circuits* published in the Proceedings of the 2009 Society for Information Display International Symposium Jun. 2-5, 2009, in San Antonio Tex., US, vol. 40, Book 2, ISSN 0009-0966X, paper 63.2 p. 947 and in *Inorganic light-emitting diode displays using micro-transfer printing* published in the Journal of the Society for Information Display 25/10, 2017, 1071-0922/17/2510-06, DOI #10.1002/jsid.610, p. 589. In this approach, small integrated circuits are formed over a patterned sacrificial layer on the process side of a crystalline wafer. The small integrated circuits, or chiplets, are released from the wafer by etching the patterned sacrificial layer beneath the circuits. A PDMS stamp is pressed against the wafer and the process side of the chiplets is adhered to the stamp. The chiplets are removed from the wafer by the stamp and are pressed against a destination substrate or backplane coated with an adhesive and thereby adhered to the destination substrate. The adhesive is subsequently cured. In another example, U.S. Pat. No. 8,722,458 entitled Optical Systems Fabricated by Printing-Based Assembly teaches transferring light-emitting, light-sensing, or light-collecting semiconductor elements from a wafer substrate to a destination substrate or backplane.

Small transfer-printed components can be micro-assembled into modules and the modules can be micro-assembled into systems. For example, U.S. Pat. No. 10,217,730 discloses providing a source wafer with source devices, micro-assembling the source devices onto an intermediate support of an intermediate wafer to make an intermediate device, and then micro-assembling the intermediate device from the intermediate wafer to a destination substrate. In this way, a large variety of heterogeneous source components can be micro-assembled and interconnected in a common module (e.g., a micro-module) and the module can be employed in an electronic or optoelectronic system comprising a variety of materials.

There remains a need for module structures and materials and micro-transfer printing methods for a variety of different micro-components that efficiently, accurately, and precisely enable the micro-assembly of the micro-components into modules and the assembly of the modules into a system.

SUMMARY

In some examples of the present disclosure, a micro-component module comprises a module substrate, a component disposed on the module substrate, and at least a portion of a module tether in contact with the module substrate. The module substrate can be flexible and can comprise an organic material, a polymer, or a polyimide. The module tether can be more brittle than the module substrate. The module substrate can have a first flexibility that is more flexible than a second flexibility of the component. In some embodiments, the module tether comprises an organic material, a polymer, a photoresist, an inorganic material, a crystalline inorganic material, an amorphous inorganic material, silicon oxide, or silicon nitride. According to some embodiments, the micro-component module is disposed, for example by micro-transfer printing, from a module source wafer to a target system substrate. The system substrate can be more flexible than the module substrate.

In some embodiments, an encapsulation layer is disposed over the component, the module substrate, or both. The component can be at least partly disposed in a mechanically neutral stress plane of the micro-component module. The encapsulation layer can comprise an organic material, the encapsulation layer can comprise a layer of organic material and a layer of inorganic material, the encapsulation layer can comprise a layer of inorganic material and a layer of organic material that is thicker than the layer of inorganic material, the encapsulation layer can comprise a layer of inorganic material disposed between layers of organic material, the encapsulation layer can comprise alternating layers of inorganic material and layers of organic material, the encapsulation layer can comprise a same material as the module substrate, or any combination of these. The encapsulation layer can have a non-planar topography or define an anti-stiction structure, for example on a side of the component opposite the module substrate. The encapsulation layer can comprise a lower encapsulation sublayer disposed on, over, or in contact with the module substrate and components and can comprise an upper encapsulation sublayer disposed on the lower encapsulation sublayer. The module substrate and the encapsulation together can entirely encapsulate the component. The module substrate can comprise spikes that protrude from the module substrate in a direction opposite the component. The spikes can be an anti-stiction structure. The spike and the module substrate can comprise a common material.

According to some embodiments of the present disclosure, component interconnections are connected to the component and disposed on the encapsulation layer. In some embodiments, component interconnections are connected to the component and disposed within the encapsulation layer and the encapsulation layer comprises component interconnection vias. In some embodiments, the component interconnections are disposed on the lower encapsulation sublayer and the upper encapsulation sublayer is disposed over, on, or in contact with the component interconnections. Interconnections can be wavy or serpentine interconnections.

According to some embodiments, the module substrate comprises any one or combination of an organic material, a layer of organic material and a layer of inorganic material, a layer of inorganic material and a layer of organic material that is thicker than the layer of inorganic material, a layer of inorganic material disposed between layers of organic material, or alternating layers of inorganic material and layers of organic material.

According to some embodiments, the component is an integrated circuit, is an electronic, optical, electromagnetic, or optoelectronic device, is a semiconductor device, is a piezoelectric device, is an acoustic filter, is a bare die, is a color converter, or comprises multiple devices. The component can comprise a component tether or be connected to or in contact with a component tether. The component tether can extend from an edge of the component, for example in a direction substantially parallel to a surface of the module substrate on which the component is disposed. The module tether can be disposed in a layer that extends over the module substrate or can be disposed in or a portion of an encapsulating layer. A portion of each of a plurality of module tethers can be contact with the module substrate or encapsulation layer.

According to some embodiments, at least a portion of a component tether can be at least a portion of a module tether. According to some embodiments, the module substrate comprises at a least a portion of a module tether. According to some embodiments, the component comprises at least a portion of a module tether. According to some embodiments, the at least a portion of a module tether extends laterally from the module substrate. According to some embodiments, the at least a portion of a module tether is a broken or separated tether. According to some embodiments, the at least a portion of a module tether physically connects the micro-component module to a source wafer.

In some embodiments of the present disclosure, the module substrate has a length or width greater than 200 microns (e.g., no smaller than 400 microns, no smaller than 500 microns, no smaller than 700 microns, or no smaller than 1000 microns). In some embodiments of the present disclosure, the component has a length or width no greater than 200 microns (e.g., no greater than 100 microns, no greater than 50 microns, no greater than 20 microns, or no greater than 10 microns).

A module structure, for example a passive electrical component such as a resistor, capacitor, inductor, conductor, or an antenna, can be formed on or in the module substrate. The module structure can be connected to the component, for example with a module interconnection. Multiple components can be interconnected with module interconnections or component interconnections. Devices or controllers external to the micro-component module can be connected to the module interconnections or component interconnections.

According to some embodiments of the present disclosure, a micro-component module comprises a module substrate comprising, an internal module cavity surrounded by the module substrate, and a component disposed on the module substrate. The module substrate can be flexible, the module substrate can comprise an organic material, the module tether can be more brittle than the module substrate, the component can have a component flexibility less than a module substrate flexibility, or at least a portion of a module tether can contact the module substrate.

According to some embodiments of the present disclosure, a micro-component module system comprises a system substrate and one or more micro-component modules. Each micro-component module can comprise a flexible module substrate and a component disposed on the module substrate. According to some embodiments, the system substrate is more flexible than the module substrate, the system substrate is a security paper, the system substrate is a banknote, the system substrate is paper, polymer, or a combination of paper and polymer, the system substrate comprises any one or combination of a security strip, mylar, a holographic structure, a foil, a metalized surface, or an aluminized surface, or any combination of these.

According to some embodiments of the present disclosure, a micro-component module wafer comprises a wafer, a sacrificial layer comprising sacrificial portions laterally separated by anchors disposed on the wafer or forming a layer of the wafer, and a micro-component module disposed entirely on and directly over each sacrificial portion, wherein the micro-component module comprises a flexible module substrate and one or more components disposed on the flexible module substrate.

According to embodiments of the present disclosure, a micro-component module wafer comprises a wafer, a sacrificial layer comprising sacrificial portions laterally separated by anchors disposed on the wafer or forming a layer of the wafer, a micro-component module disposed entirely on and directly over each sacrificial portion, and a module tether connecting each micro-component module to an anchor.

According to embodiments of the present disclosure, a method of making micro-component module wafer, comprises providing a module source wafer comprising a sacrificial layer comprising sacrificial portions laterally separated by anchors, disposing a module substrate exclusively on and directly over each sacrificial portion, disposing a component on each module substrate, the module substrate more flexible than the component, and providing a module tether connecting the module substrate to an anchor. Methods of the present disclosure can comprise disposing an encapsulation layer over the component. Methods of the present disclosure can comprise etching the sacrificial portions. Methods of the present disclosure can comprise transfer printing the micro-component module to a system substrate. In some embodiments the system substrate is no less flexible or is more flexible than the module substrate.

According to some embodiments of the present disclosure, a micro-component module wafer, comprises a wafer, a sacrificial layer comprising sacrificial portions laterally separated by anchors disposed on the wafer or forming a layer of the wafer and internal anchors, and a micro-component module disposed entirely on and directly over each of the sacrificial portions. The micro-component module comprises (i) a module substrate comprising an internal module cavity through and surrounded by the module substrate that is aligned with one or more of the internal anchors and (ii) a component disposed on the module substrate and the micro-component module is physically connected to each of the one or more internal anchors by an internal module tether. According to some embodiments, the micro-component module is connected to one of the anchors by a module tether. The internal module tether can be smaller than the module tether (e.g., by at least 25%, at least 30%, at least 40%, or at least 50%), each of the internal anchors is smaller than the anchors, or both.

According to some embodiments, one or more anti-stiction structures protrude from the micro-component module toward the wafer through the sacrificial portion. The module substrate can have at least one of a width and a length greater than 200 microns (e.g., no smaller than 400 microns, no smaller than 500 microns, no smaller than 700 microns, or no smaller than 1000 microns). The module substrate can be disposed at least partially in a same plane relative to a surface of the wafer as the internal anchors. The internal module tether can laterally extend from the module substrate into the internal module cavity.

According to some embodiments of the present disclosure. a method of making a micro-component module wafer comprises providing a module source wafer comprising a sacrificial layer comprising sacrificial portions laterally separated by anchors, providing internal anchors in the sacrificial layer, disposing a module substrate entirely on and directly over each of the sacrificial portions, wherein the module substrate comprises an internal module cavity through and surrounded by the module substrate and the internal module cavity is aligned with one or more of the internal anchors, forming an internal module tether that physically connects the module substrate to one of the internal anchors, and providing a component on the module substrate to form a micro-component module. The module substrate can be flexible. The module substrate can comprise an organic material, a polymer, or a polyimide. The module substrate can have at least one of a width and a length greater than 200 microns (e.g., no smaller than 400 microns, no smaller than 500 microns, no smaller than 700 microns, or no smaller than 1000 microns).

Some embodiments of the present disclosure comprise forming the internal anchors before disposing the module substrate. Some embodiments of the present disclosure comprise patterning the internal module cavity and subsequently forming the internal anchors.

Some embodiments of the present disclosure can comprise etching the sacrificial portions at least in part by etching through the internal module cavity. Some embodiments can comprise disposing the module substrate entirely on and directly over each of the sacrificial portions and subsequently patterning the internal module cavity. Some embodiments can comprise patterning the sacrificial portions to form the internal anchors. Some embodiments can comprise forming the internal anchors and subsequently disposing the sacrificial portions such that the sacrificial portions are laterally separated by the anchors. Some embodiments can comprise printing one or more micro-component modules from the module source wafer thereby breaking or separating any internal tether that had physically connected the one or more micro-component modules to the module source wafer.

According to some embodiments of the present disclosure, a micro-component module system comprises a system substrate and one or more micro-component modules disposed on the system substrate. The system substrate can be flexible and can be more flexible than the module substrate.

According to embodiments of the present disclosure, a micro-component module comprises a module substrate having a top side and an opposing bottom side, wherein the module substrate is flexible, a component disposed on the top side of the module substrate, and a module tether. The module tether extends (i) beyond the module substrate and (ii) beneath only a portion of the bottom side of the module substrate, within only a portion of the module substrate, or both. Thus, at least a portion of the module tether extends and is disposed beyond the module substrate, e.g., extends from an edge or side of the module substrate, and at least a portion of the module tether extends and is disposed in contact with only a portion of the bottom side of the module substrate or within (inside) the module substrate, or both. In some embodiments, the module tether extends beneath only a portion of the bottom side of the module substrate. In some embodiments, the module tether extends only within a portion of the module substrate, e.g., a portion of the module substrate is disposed above a portion of the module tether and a portion of the module substrate is disposed beneath the module tether. In some embodiments, the module tether further extends on only a portion of the top side of the module substrate.

According to some embodiments, the module tether is more rigid than the module substrate. The module substrate can be organic and the module tether can be inorganic. The module substrate can be polyimide, the module tether can be an oxide or a nitride, or both. The module tether can be made of silicon dioxide or silicon nitride. According to some embodiments, the module tether is broken (e.g., fractured).

In some embodiments, a micro-component module comprises a second module tether wherein the second module tether extends (i) beyond the module substrate and (ii) beneath only a portion of the bottom side of the module substrate, within only a portion of the module substrate, or both.

Some embodiments comprise an encapsulation layer disposed on the module substrate and the component and the module tether extends on only a portion of the encapsulation layer. Some embodiments comprise an encapsulation layer disposed on the module substrate and the component and the encapsulation layer extends over only a portion of the module tether. The encapsulation layer can comprise (e.g., is or includes) a same material as the module substrate.

According to embodiments of the present disclosure, a micro-component module source wafer comprises a wafer and a micro-component module suspended over the wafer by one or more module tethers defining a gap between the micro-component module and the wafer. The module substrate can be curved and, in some embodiments, is not in contact with the wafer other than by the module tether(s).

According to embodiments of the present disclosure, a micro-component module source wafer comprises a wafer, a sacrificial layer comprising sacrificial portions laterally separated by anchors disposed on the wafer or forming a layer of the wafer, and a micro-component module disposed directly on and entirely over each of the sacrificial portions such that the module tether is connected to one of the anchors. Each of the sacrificial portions can comprise a low-adhesion surface on which the micro-component module is at least partially disposed.

According to embodiments of the present disclosure, a method of making a micro-component module comprises providing a micro-component module source wafer and removing the micro-component module from the wafer with a stamp, thereby breaking (e.g., fracturing) the module tether.

According to embodiments of the present disclosure, a method of making a micro-component module comprises providing a micro-component module source wafer, the micro-component module source wafer comprising: (i) a peeling layer comprising peeling portions laterally separated by anchors disposed on the wafer or forming a layer of the wafer and (ii) a respective micro-component module disposed directly on and entirely over each of the peeling portions, wherein the module tether of the micro-component module is connected to one of the anchors, and removing the respective micro-component module from the wafer with a stamp by peeling the module substrate of the micro-component module off of the peeling portion from a corner or edge of the module substrate of the micro-component module. Removing the micro-component module from the wafer with the stamp can comprise moving the stamp laterally in a direction away from the corner or edge.

Certain embodiments of the present disclosure provide micro-component modules with flexible module substrates micro-transfer printed onto a flexible system substrate.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which.

Figure 1:
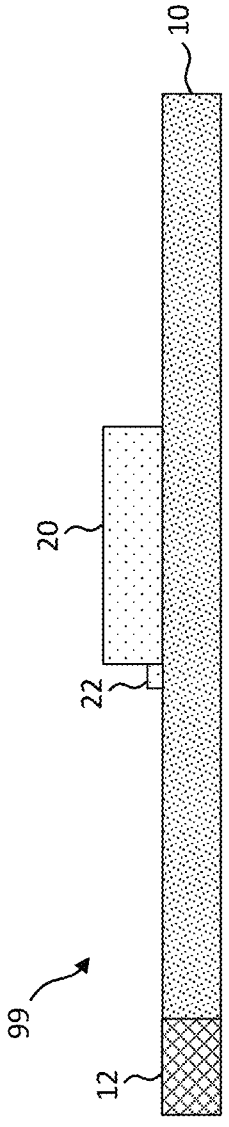
FIG. 1 is a schematic cross section of a micro-component module according to illustrative embodiments of the present disclosure.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF CERTAIN EMBODIMENTS

Certain embodiments of the present disclosure provide, inter alia, printable micro-component modules comprising a flexible module substrate disposed on a flexible system substrate in a flexible system. Such a flexible system can exhibit greater operational robustness when stressed by mechanical bending, for example when in use. As used herein, a flexible material or structure can deform in response to mechanical stress and then return to its original shape when the mechanical stress is removed, e.g., the flexible material or structure is capable of demonstrating elastic deformation. The micro-component modules can comprise components from different native source wafers comprising different materials, including semiconductors such as doped or undoped silicon or various doped or undoped compound semiconductors. Each micro-component in the module can be made in the material that is best suited to the function of the micro-component. By including such components together in a printable micro-component module, robust electrical, optical, or electrical and optical interconnections can be made that withstand normal use conditions of a flexible system that incorporates the module.

By using a flexible, organic, or polymer module substrate for such a printable micro-component module, larger modules can be used that are less prone to mechanical degradation (e.g., breakage) or separation from an underlying flexible system substrate (e.g., due to bending or folding of the system substrate). As just one example, a micro-component module that includes a flexible module substrate can be used in conjunction with a banknote as a security feature for the banknote while better withstanding normal use of the banknote than a similar module with a rigid substrate. As used herein, a "printable micro-component module" is a module that is capable of being printed (e.g., by micro-transfer printing) or has been printed to a destination substrate.

According to some embodiments of the present disclosure and as illustrated in FIG. 1, a printable micro-component module 99 comprises a module substrate 10, a component 20 disposed on module substrate 10, and at least a portion of a module tether 12 in contact with module substrate 10. In some embodiments, at least a portion of a module tether 12 is a broken (e.g., fractured) or separated tether, for example if printable micro-component module 99 has been printed. In some embodiments, at least a portion of a module tether 12 is a module tether 12 that physically connects printable micro-component module 99 to a micro-component module source wafer 40 (as described further subsequently). Module tether 12 can be in a common layer or can comprise common materials with module substrate 10. Module tether 12 can extend (e.g., laterally) from module substrate 10. In some embodiments, module tether 12 is in a different layer from module substrate 10 or comprises different materials from module substrate 10. Module substrate 10 can be flexible and can comprise layers of organic and inorganic materials that protect micro-component modules 99 from environmental contaminants. Component 20 can include component tether 22, which can be broken (e.g., fractured) or separated as a result of a printing process (e.g., micro-transfer printing). In some embodiments, component tether 22 is module tether 12, for example where component 20 is disposed near an edge of module substrate 10. In some embodiments, module substrate 10 comprises at least a portion of a module tether 12. In some embodiments, component 20 comprises at least a portion of a module tether 12.

Module tether 12 can be directly or indirectly connected to (e.g., physically attached to or in contact with) module substrate 10, for example attached to or protrude or extend (e.g., laterally) from a side or edge of a substantially planar module substrate 10. For example, module tether 12 can be connected to (e.g., physically attached to or in contact with) an edge of module substrate 10 that extends in a direction different from a surface of module substrate 10, for example a direction that is substantially orthogonal to a surface of module substrate 10 on which is disposed component 20. Thus, module tether 12 can primarily extend in a direction substantially parallel with the module substrate surface. Module tether 12 can directly or indirectly physically connect (e.g., attach) module substrate 10 to an anchor 54 of a module source wafer 40 (e.g., a micro-component module 99 source wafer 40 discussed further below with respect to FIGS. 10A-10O). According to some embodiments, module tether 12 is broken (e.g., fractured) as a consequence of transfer printing (e.g., micro-transfer printing) micro-component module 99 from module source wafer 40 to a system substrate 70 (discussed further subsequently). Thus, module tether 12 can be a broken (e.g., fractured) or separated tether.

Component 20 can be an unpackaged component 20, for example a bare die. Component 20 can be an integrated circuit, for example a monocrystalline semiconductor integrated circuit such as a silicon integrated circuit or a compound semiconductor integrated circuit. Component 20 can be an active component (e.g., comprising transistors) or a passive component (e.g., comprising capacitors, inductors, resistor, or conductors), or include both active and passive elements. Component 20 can be a semiconductor device, a piezoelectric device, an acoustic filter, a color converter, a light-emitting diode, a laser. Component 20 can comprise multiple devices or elements or an assembly of devices or elements, for example having different functions (e.g., a controller and optoelectronic device) or having a same function with a different property (e.g., color of light emission). Such multiple devices or assembly of multiple devices can be interconnected into an electronic, optical, or optoelectronic circuit.

Component 20 can be a micro-component (e.g., having a dimension such as length and/or width less than 1,000 microns (e.g., no greater than 500 microns), but for simplicity and brevity is described herein as a component 20. In some embodiments, component 20 can have a length or width, or both, no greater than 200 microns, (e.g., no greater than 100 microns, no greater than 50 microns, no greater than 20 microns, no greater than 10 microns, or no greater than 5 microns) and, optionally, a thickness no greater than 100 microns (e.g., no greater than 50 microns, no greater than 20 microns, no greater than 10 microns, or no greater than 5 microns).

A component tether 22 can be connected to (e.g., in contact with or attached to) component 20, e.g., a broken (e.g., fractured) or separated component tether 22 resulting from transfer printing component 20 from a component source wafer to module substrate 10. For example, component tether 22 can be physically attached to, in contact with, or connected to an edge of component 20 that extends in a direction different from a surface of component 20, for example a direction that is substantially orthogonal to a surface of module substrate 10 on which is disposed component 20. Thus, component tether 22 can primarily extend in a direction substantially parallel with the module substrate surface.

According to some embodiments, module substrate 10 is flexible. Module substrate 10 can comprise an organic material. Module substrate 10 can be or comprise a polymer. Module substrate 10 can be or comprise a polyimide.

According to embodiments of the present disclosure, micro-component module 99 is micro-transfer printed from module source wafer 40 to a system substrate 70 with a stamp 60 (discussed further below with respect to FIGS. 10A-10O). As part of some micro-transfer printing processes, a tether (e.g., module tether 12) physically connects micro-component module 99 to an anchor of module source wafer 40. Stamp 60 contacts micro-component module 99, adhering micro-component module 99 to stamp 60. Stamp 60 is removed from module source wafer 40 together with micro-component module 99, breaking (e.g., fracturing) or separating module tether 12 and moved to and in alignment with system substrate 70, where stamp 60 disposes micro-component module 99 on system substrate 70. System substrate 70 can comprise an adhesive layer to facilitate disposition and adhesion of micro-component module 99 on system substrate 70. Component 20 can be similarly disposed on module substrate 10 by providing a component 20 attached to a component source wafer with component tether 22, contacting component 20 with stamp 60, removing stamp 60 from the component source wafer together with component 20, breaking (e.g., fracturing) or fracturing component tether 22, and disposing component 20 on module substrate 10.

According to embodiments of the present disclosure, module substrate 10 is flexible. If module tether 12 was likewise flexible (e.g., comprising similar materials as module substrate 10), module tether 12 may not break (e.g., fracture) as desired, but would rather bend as stamp 60 is removed from module source wafer 40, inhibiting or preventing the removal of micro-component module 99 from module source wafer 40. In order to overcome this problem, in some embodiments, different materials are used for module tether 12 and module substrate 10. Further, according to certain embodiments of the present disclosure, module tether 12 is more brittle than module substrate 10. For example, module tether 12 is less flexible than module substrate 10, module tether 12 is stiffer than module substrate 10, module tether 12 fractures more easily than module substrate 10, or module tether 12 has a greater Young's modulus than module substrate 10. Thus, module tether 12 can break (e.g., fracture) more readily than module substrate 10 when removed from module source wafer 40 with stamp 60, enabling micro-component module 99 removal from module source wafer 40. According to some embodiments, module substrate 10 has a first flexibility and module tether 12 has a second flexibility less than the first flexibility. Module tether 12 can comprise an organic material, a polymer, a photoresist, an inorganic material, a crystalline inorganic material, an amorphous inorganic material, silicon oxide, or silicon nitride, in some embodiments at the same time as module substrate 10 comprises an organic material, a polymer (e.g., that is more flexible than a polymer of module tether 12), or a polyimide.

Figure 2:
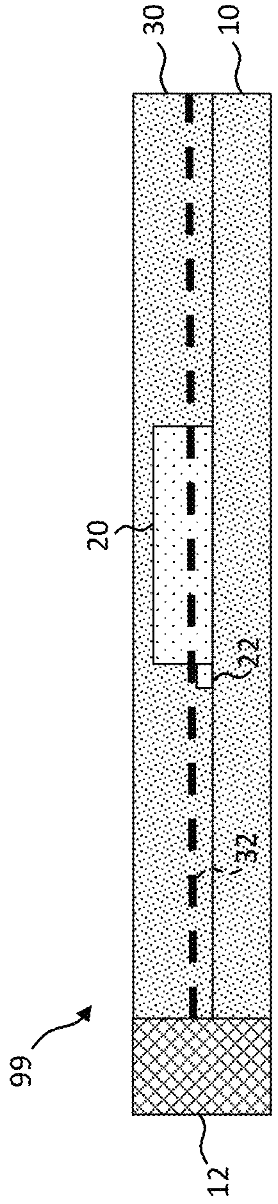
FIG. 2 is a schematic cross section of a micro-component module comprising an encapsulation layer according to illustrative embodiments of the present disclosure.

According to some embodiments, and as shown in FIG. 2, micro-component module 99 can comprise an encapsulation layer 30 disposed over component 20 (and, in some embodiments, any component tether 22), for example on (e.g., in contact with) or over component 20 on a side of component 20 opposite module substrate 10. Portions of encapsulation layer 30 can be in direct contact with module substrate 10. Encapsulation layer 30 can comprise similar or the same materials as module substrate 10, for example organic materials, polymers, or a polyimide. Encapsulation layer 30 can have the same flexibility (or Young's modulus) as module substrate 10 or can be more or less flexible than module substrate 10.

According to embodiments of the present disclosure, component 20 is at least partly disposed in a mechanically neutral stress plane 32 of micro-component module 99. That is, in some embodiments, mechanically neutral stress plane 32 of micro-component module 99 passes through component 20. Thus, when micro-component module 99 is mechanically stressed, e.g., bent, folded, creased, spindled, twisted, or otherwise mechanically manipulated in a non-planar fashion, the mechanical stress on component 20 is reduced, thereby enhancing the mechanical robustness of micro-component module 99 and reducing any propensity of micro-component module 99 to break or fracture in response to non-planar mechanical manipulation.

Figure 3A:
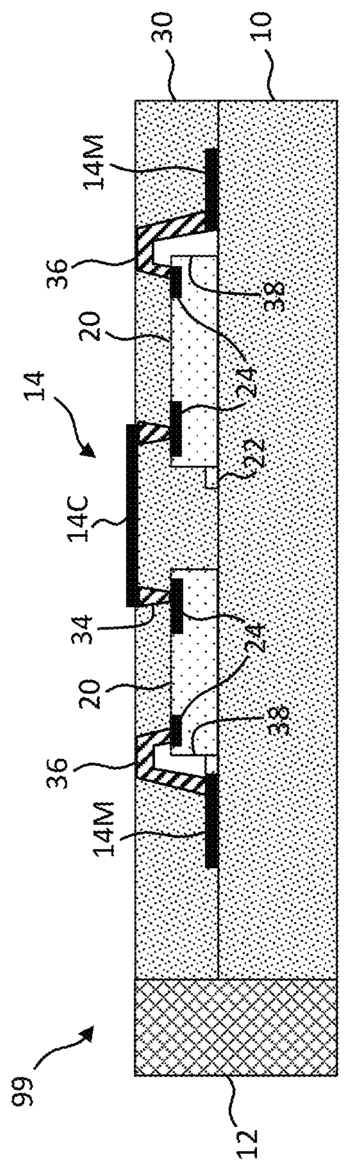
FIGS. 3A and 3B are schematic cross sections of micro-component modules comprising an encapsulation layer and component interconnections according to illustrative embodiments of the present disclosure.

According to embodiments of the present disclosure and as illustrated in FIG. 3A, micro-component module 99 can comprise multiple components 20. Components 20 can be interconnected with interconnections 14 and, in some embodiments, interconnection vias 34, for example electrical, optical, or electro-optical interconnections or vias such as wires (e.g., traces) or light pipes. Interconnections 14 can be connected to component contact pads 24 through interconnection vias 34 or with electrodes 36 insulated from bare-die components 20 with dielectric structures 38. Component interconnections 14C can be disposed at least in part on or in encapsulation layer 30 and module interconnections 14M can be disposed at least in part on module substrate 10. Component interconnections 14C and module interconnections 14M (collectively interconnections 14) can interconnect components 20 or provide external connections to external devices (not shown in the figures). Interconnections 14 can be wavy or serpentine to resist fracturing when mechanically manipulated in a non-planar fashion.

Figure 3B:
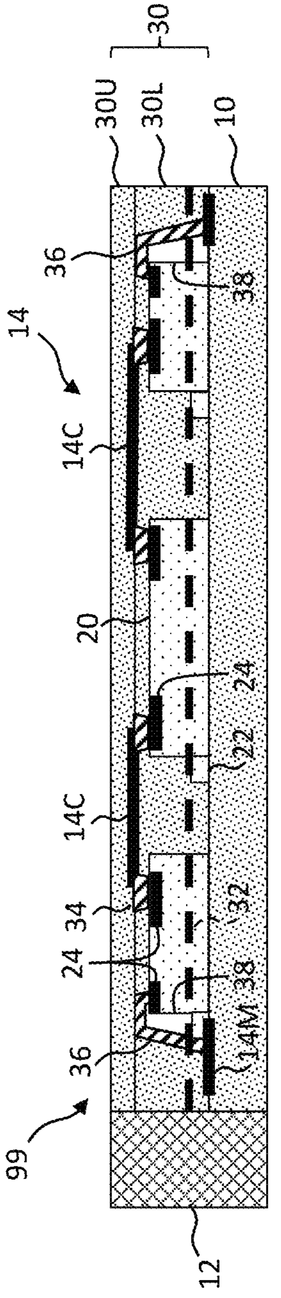

As shown in FIG. 3B, interconnections 14 can affect the stiffness of encapsulation layer 30 or module substrate 10 and can be controlled (e.g., by varying thickness or width) to locate mechanically neutral stress plane 32 where desired, for example extending through components 20. According to some embodiments, encapsulation layer 30 can encapsulate component interconnections 14C to protect component interconnections 14C and further control the stiffness of encapsulation layer 30, for example by adjusting the thickness or composition of encapsulation layer 30. In some embodiments, the module substrate and the encapsulation together entirely encapsulate the component. According to some embodiments, encapsulation layer 30 can comprise a lower encapsulation sublayer 30L disposed on module substrate 10 and components 20 and an upper encapsulation sublayer 30U can be disposed on lower encapsulation sublayer 30L. Component interconnections 14C can be disposed on lower encapsulation sublayer 30L. Upper encapsulation sublayer 30U can be disposed over or on (e.g., in contact with) component interconnections 14C and lower encapsulation sublayer 30L. In some embodiments, component interconnections 14C are disposed within lower encapsulation sublayer 30L; in some embodiments, component interconnections 14C are disposed within upper encapsulation sublayer 30U; in some embodiments, component interconnections 14C are disposed between upper and lower encapsulation sublayers 30U and 30L. Upper and lower encapsulation sublayers 30U and 30L can comprise the same or different materials.

Figure 4:
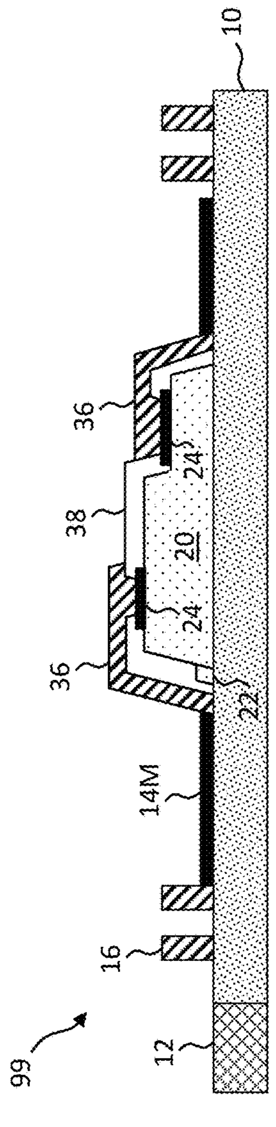
FIG. 4 is a schematic cross section of a micro-component module comprising a component, module structures, and module interconnections according to illustrative embodiments of the present disclosure.

According to some embodiments of the present disclosure and as shown in FIG. 4, micro-component module 99 can comprise a module structure 16 formed on module substrate 10 before or after component 20 is disposed on module substrate 10. Module structure 16 can be formed, for example, by photolithographic processing methods and materials. Module structure 16 can be or comprise, for example, an antenna, a capacitor, a resistor, an inductor, a light pipe (e.g., a light guide or optical fiber), or an optical structure such as a reflector (e.g., mirror), refractor (e.g., lens), or diffractor. Module structure 16 can be interconnected with interconnections 14 (e.g., module interconnections 14M) to components 20 or to external devices, such as system controllers (not shown in the Figures), any or all of which can be functional elements enabling micro-component module 99 to operate and provide a desired function.

According to some embodiments of the present disclosure and as illustrated in FIGS. 5A-5D and FIG. 6, module substrate 10 can comprise multiple layers, for example organic module substrate layers 10A disposed in alternation with inorganic module substrate layers 10B. The multiple organic and inorganic module substrate layers 10A and 10B can provide chemical resistance to chemical contaminants (e.g., liquids or gases) as well as providing a mechanism for controlling the flexibility of module substrate 10. For example, organic module substrate layer 10A can be resistant to a contaminant that affects inorganic module substrate layer 10B, or vice versa. Organic module substrate layers 10A can be or comprise a polymer (e.g., a plastic), such as a polyimide, and inorganic module substrate layers 10B can be or comprise oxides (e.g., silicon oxide or aluminum oxide), nitrides (e.g., silicon nitride), metals, ceramics, sapphire, or quartz.

Figure 5A:
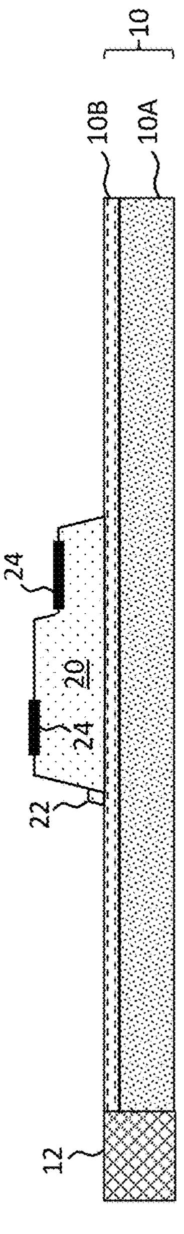
FIGS. 5A-5D are schematic cross sections of multi-layer module substrates according to illustrative embodiments of the present disclosure.
Figure 5B:
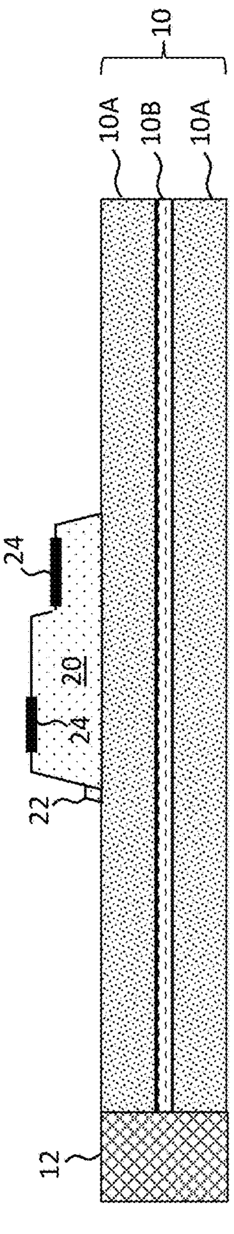
Figure 5C:
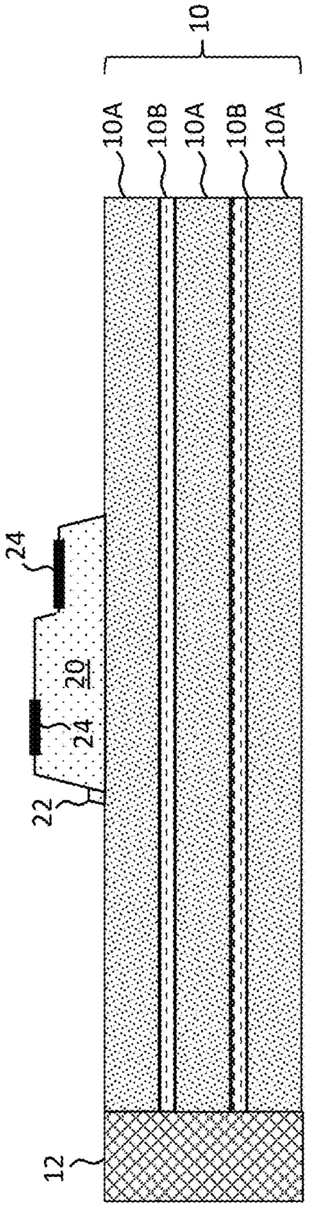
Figure 5D:
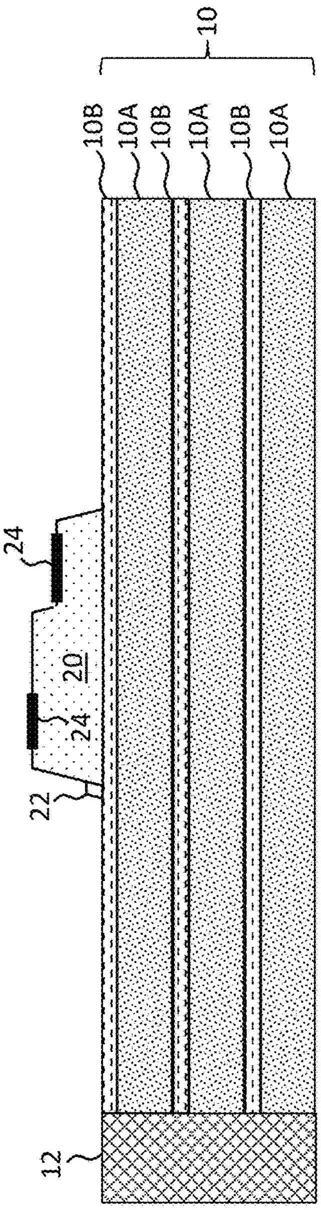

As shown in FIG. 5A a single inorganic module substrate layer 10B is disposed on a single organic module substrate layer 10A. According to some embodiments, component 20 is disposed on inorganic module substrate layer 10B. FIG. 5B illustrates module substrate 10 comprising inorganic module substrate layer 10B disposed between organic module substrate layer 10A with component 20 disposed on organic module substrate layer 10A. FIG. 5C illustrates module substrate 10 with five alternating inorganic module substrate layers 10B and organic module substrate layers 10A with component 20 disposed on the top organic module substrate layer 10A adjacent to component 20. FIG. 5D illustrates module substrate 10 with six alternating inorganic module substrate layers 10B and organic module substrate layers 10A with component 20 disposed on the top inorganic module substrate layer 10B adjacent to component 20. Component 20 can be disposed on inorganic module substrate layer 10B and can serve as a dielectric surface on which module interconnections 14M are disposed, for example by photolithography.

Figure 6:
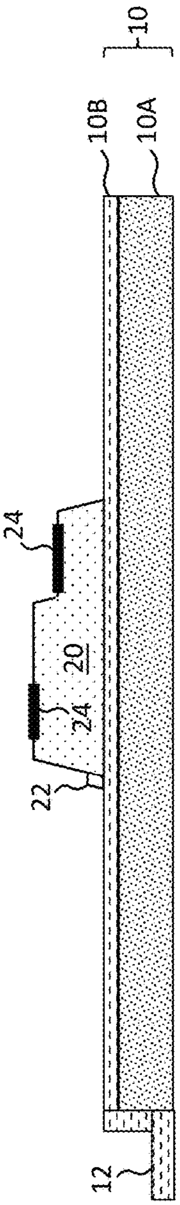
FIG. 6 is a schematic cross section of a module substrate with a module tether according to illustrative embodiments of the present disclosure.

Organic module substrate layers 10A can be thicker than inorganic module substrate layers 10B, as shown in FIGS. 5A-5D. According to some embodiments, an organic module substrate layer 10A is on a side of module substrate 10 opposite component 20 and an inorganic module substrate layer 10B is on a side of module substrate 10 adjacent to, in contact with, or adhered to component 20. As illustrated in FIG. 6, module tether 12 can be or comprise a same material as inorganic module substrate layer 10B and can be formed in a common step or disposed in a common layer with inorganic module substrate layer 10B. According to some embodiments, module tether 12 is exclusively inorganic and module substrate 10 is only partially inorganic so that module tether 12 is more brittle and prone to fracture under non-planar mechanical stress than is module substrate 10.

Organic module substrate layer 10A can be flexible. Organic module substrate layer 10A can be or comprise a polymer or can be or comprise a polyimide. Inorganic module substrate layer 10B can be flexible (but can be more or less flexible than organic module substrate layer 10A) and can be or comprise an inorganic material such as silicon oxide (e.g., silicon dioxide) or silicon nitride. Material of inorganic module substrate layer 10B can be less flexible than material of organic module substrate layer 10A but, can be disposed in a thinner layer than organic module substrate layer 10A. Organic module substrate layers 10A and inorganic module substrate layers 10B can be formed and patterned using material deposition and patterning methods known in, for example, photolithography.

Figure 7A:
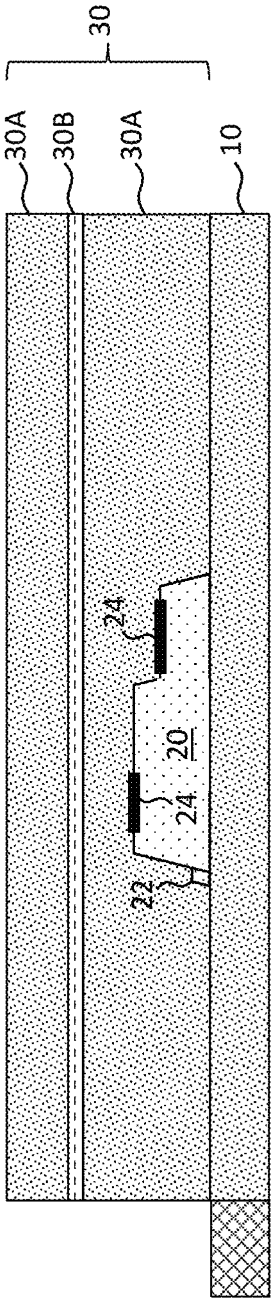
FIGS. 7A-7C are schematic cross sections of a multi-layer encapsulation layer according to illustrative embodiments of the present disclosure.

As shown in FIG. 7A, according to some embodiments of the present disclosure, encapsulation layer 30 can comprise one or more organic and inorganic layers such as organic encapsulation layer 30A and inorganic encapsulation layer 30B. Any of the module substrate 10 layer arrangements shown in FIGS. 5A-5D can be applied to encapsulation layer 30. FIG. 7A illustrates encapsulation layer 30 comprising three alternating layers of organic encapsulation layers 30A and inorganic encapsulation layer 30B, with the top and bottom layers comprising organic encapsulation layers 30A (e.g., where the top layer is on a side of encapsulation layer 30 opposite component 20 or module substrate 10 and the bottom layer is adjacent to or in contact with component 20 or module substrate 10. Each of upper and lower encapsulation sublayers 30U and 30L can comprise one or more layers, for example alternating layers, of organic encapsulation layers 30A and inorganic encapsulation layers 30B. Encapsulation layer 30 can comprise one or more same materials as module substrate 10, either organic or inorganic. Where encapsulation layer 30 and module substrate 10 comprise only a single organic layer (e.g., a polyimide), both encapsulation layer 30 and module substrate 10 can comprise the same material. Where encapsulation layer 30 and module substrate 10 comprise alternating organic and inorganic layers, organic encapsulation layer 30A can be or comprise the same material as organic module substrate layer 10A and inorganic encapsulation layer 30B can be or comprise the same material as inorganic module substrate layer 10B. Component interconnections 14C can be disposed on, or interconnection vias 34 can be formed in, any one of organic or inorganic encapsulation layers 30A, 30B.

Figure 7B:
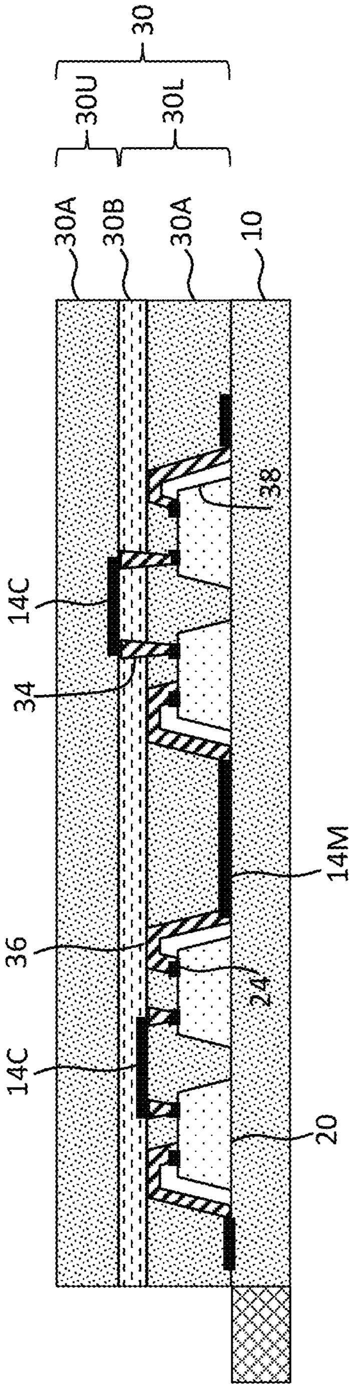
Figure 7C:
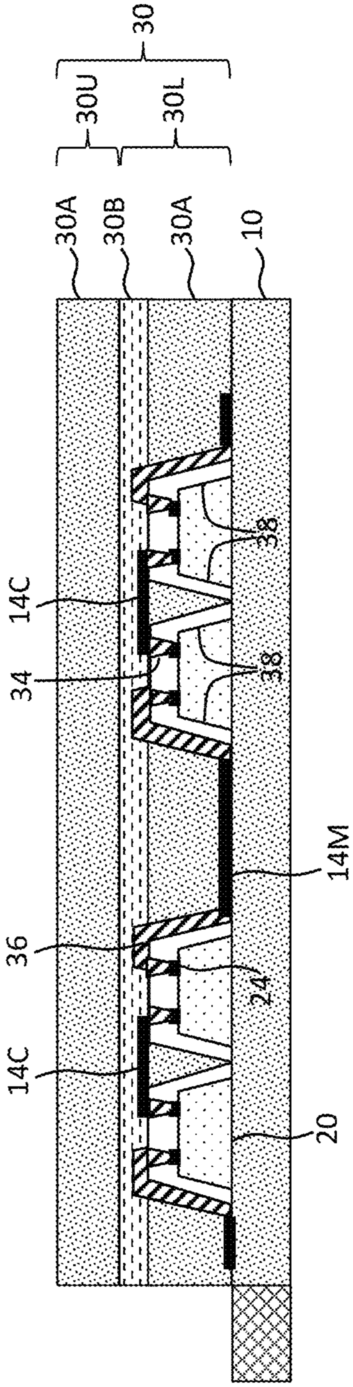

As illustrated in embodiments according to FIG. 7B, component interconnections 14C can be disposed on lower encapsulation sublayer 30L, organic encapsulation layer 30A (shown on the left side of FIG. 7A), or inorganic encapsulation 30B (shown on the right side of FIG. 7A) and electrically connected to component contact pad 24 of component 20 through interconnection vias 34. As shown in FIG. 7B, inorganic encapsulation layer 30B is a part of lower encapsulation sublayer 30L and component interconnections 14C (shown on the left side) are disposed within lower encapsulation sublayer 30L. Alternatively, inorganic encapsulation layer 30B could be a part of upper encapsulation sublayer 30U and component interconnections 14C (shown on the right side) disposed within upper encapsulation layer 30U. As illustrated in embodiments according to FIG. 7C, dielectric structures 38 can encapsulate and electrically insulate component 20 (except for interconnection vias 34) and component interconnections 14C can be disposed at least in part on dielectric structures 38.

Figure 8:
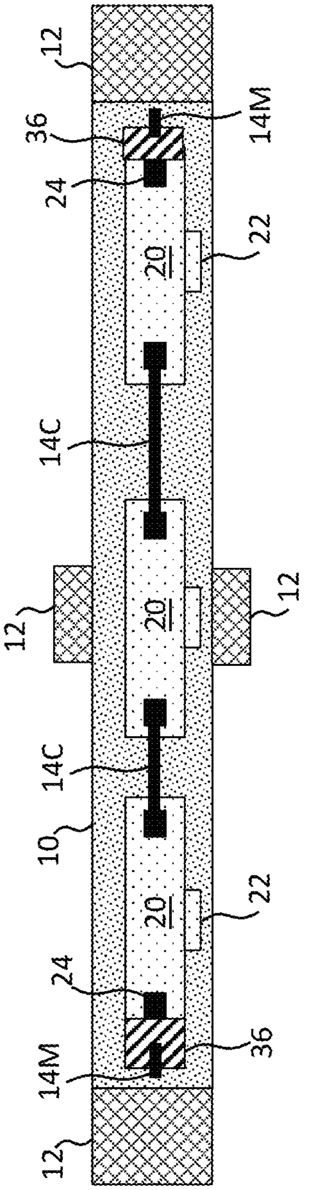
FIG. 8 is a schematic top view of a micro-component module with multiple components, multiple module tethers, and interconnections according to illustrative embodiments of the present disclosure.

According to some embodiments of the present disclosure and as illustrated in the plan (top) view of FIG. 8, at least a portion of each of a plurality of module tethers 12 are in contact with or attached to module substrate 10 or encapsulation layer 30. Some micro-component modules 99 can be long and thin, for example comprising components 20 that are lasers. In some such embodiments, a flexible module substrate 10 once released from module source wafer 40 can sag and experience stiction between module substrate 10 and module source wafer 40, inhibiting picking micro-component module 99 from module source wafer 40 with stamp 60. Additional module tethers 12 disposed around the periphery of micro-component module 99, especially along a long edge of micro-component module 99, can provide additional support to micro-component module 99, prevent or reduce stiction, and enable micro-component module 99 pickup by stamp 60. Such module tethers 12 can be offset from each other, for example with one at a first end on a first side and another at an opposing second end on an opposing second side, or oppose each other, for example with two at each end respectively on opposing sides.

Figure 9:
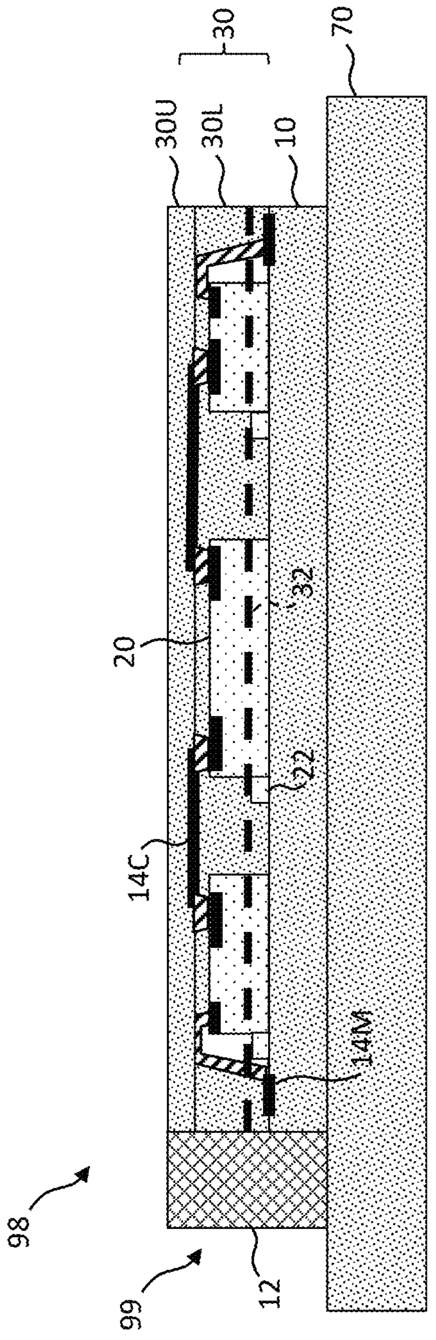
FIG. 9 is a schematic cross section of a multi-component module system according to illustrative embodiments of the present disclosure.

Printable micro-component modules 99 can be disposed on a system substrate 70 to form a micro-component module system 98, as shown in FIG. 9, for example by micro-transfer printing a micro-component module 99 from a micro-component module source wafer 97 (discussed below with respect to FIGS. 10A-10O) to system substrate 70. One or more micro-component modules 99 can be disposed on system substrate 70 to form a printed micro-component module 99. System substrate 70 can be a flexible substrate and can be more flexible than module substrate 10 and module substrate 10 can be more flexible than components 20. System substrate 70 can be paper, polymer, or a combination of paper and polymer. System substrate 70 can be a security paper, for example a banknote, or can be any one or combination of a security strip, mylar, a holographic structure, a foil, a metalized surface, or an aluminized surface.

In rigid systems, a rigid micro-component module disposed on a larger rigid destination (target) substrate is not subject to as much mechanical stress as the rigid destination substrate since the rigid destination substrate is larger and force applied to the rigid system will be primarily applied to the rigid destination substrate. Even if a destination substrate is relatively flexible, if a rigid micro-component module disposed on the flexible destination substrate is sufficiently small, in some embodiments the amount of mechanical stress applied to the rigid micro-component module is relatively limited, particularly if the mechanical stress is applied manually, e.g., by a human hand, which can be relatively large compared to the rigid micro-component module. However, if a micro-component module 99 is comparable in size to something that can be felt, pressed, or manipulated by the human hand (for example no less than 0.2 mm or no less than 0.5 mm, it can be directly manually felt and stressed. In some such embodiments, a flexible module substrate 10 of a relatively flexible micro-component module 99 can survive the manual mechanical stress, and the smaller, more rigid components 20 can be protected from manual mechanical stress by the more flexible module substrate 10. Therefore, according to embodiments of the present disclosure, module substrate 10 has a size that can be manually directly felt or mechanically stressed, for example having a size in the range of 200 microns to 500 microns or 500 microns to 1000 microns or larger. For example, module substrate 10 can have at least one of a length and a width greater than 200 microns (e.g., no smaller than 400 microns, no smaller than 500 microns, no smaller than 700 microns, or no smaller than 1000 microns, or larger). In contrast, more-rigid components 20 can be smaller than more-flexible module substrate 10, for example no greater than 200 microns, 100 microns, 50 microns, 20 microns, or 10 microns in a length or a width dimension, or both, and can be less manually palpable than micro-component module 99, even if component 20 is relatively rigid.

Figure 10A:
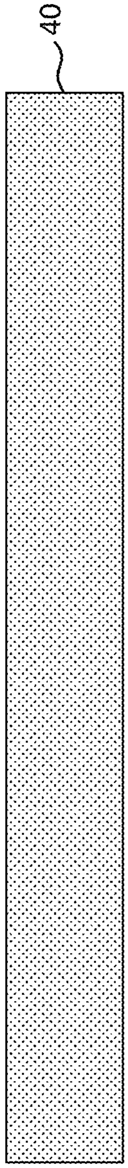
FIGS. 10A-10O are successive schematic cross sections illustrating exemplary methods and micro-component module wafers, structures, and systems in the construction and printing of exemplary micro-component modules according to illustrative embodiments of the present disclosure.
Figure 10B:
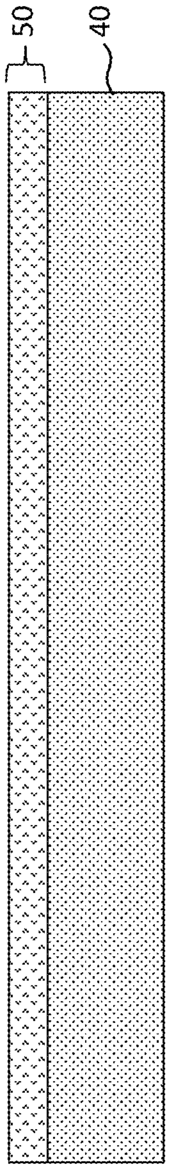
Figure 10C:
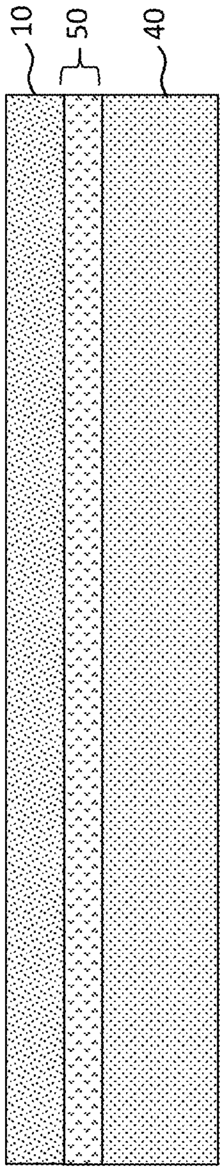
Figure 10D:
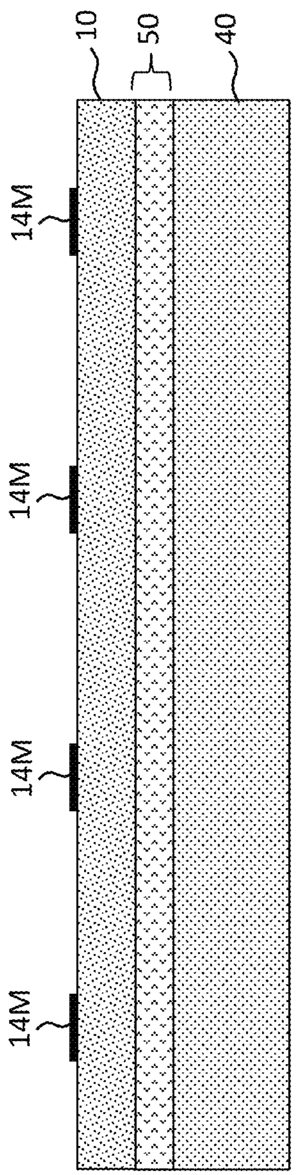
Figure 10E:
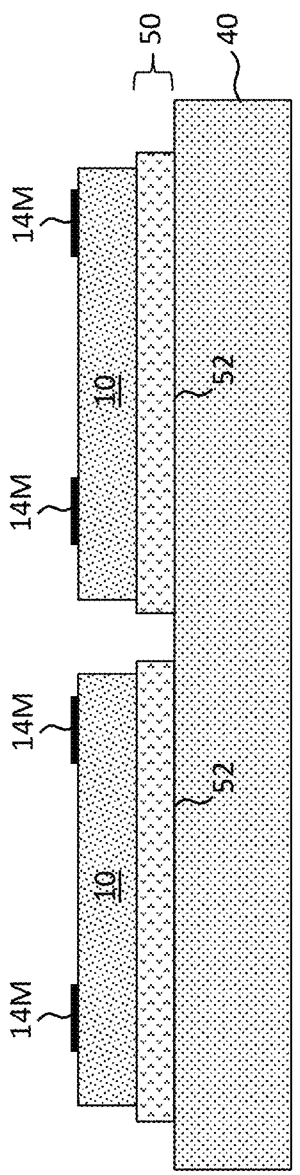
Figure 10F:
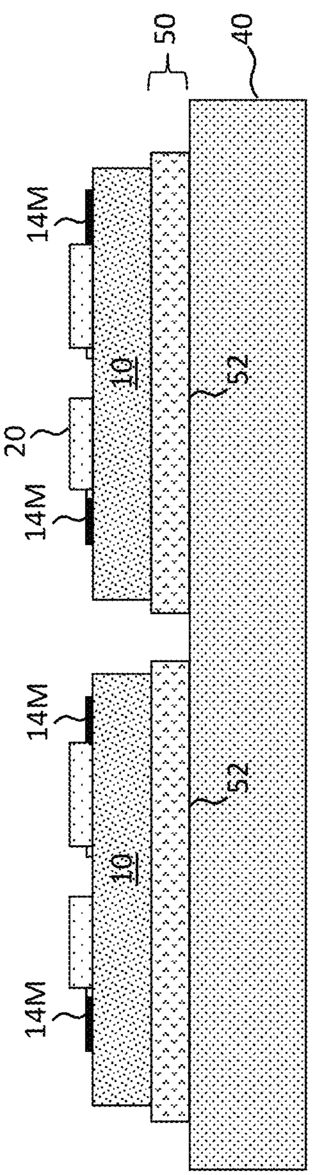
Figure 10G:
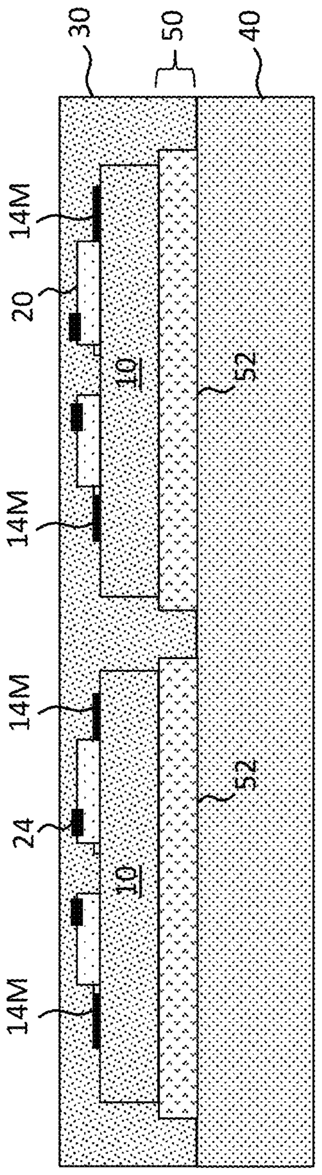
Figure 10H:
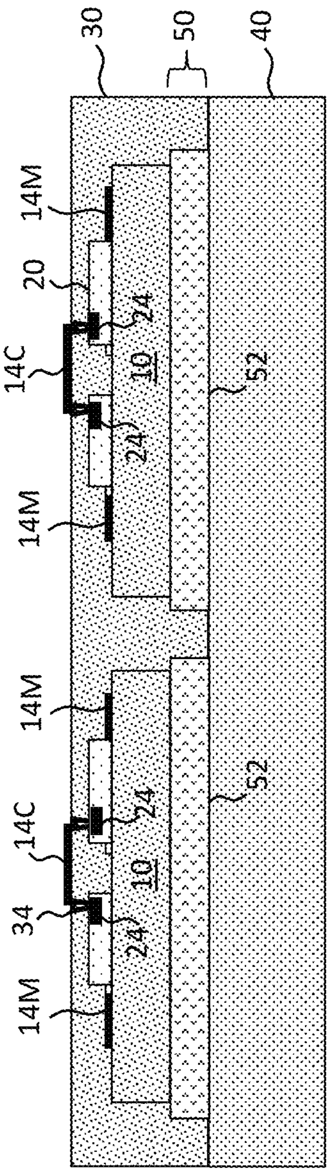
Figure 10I:
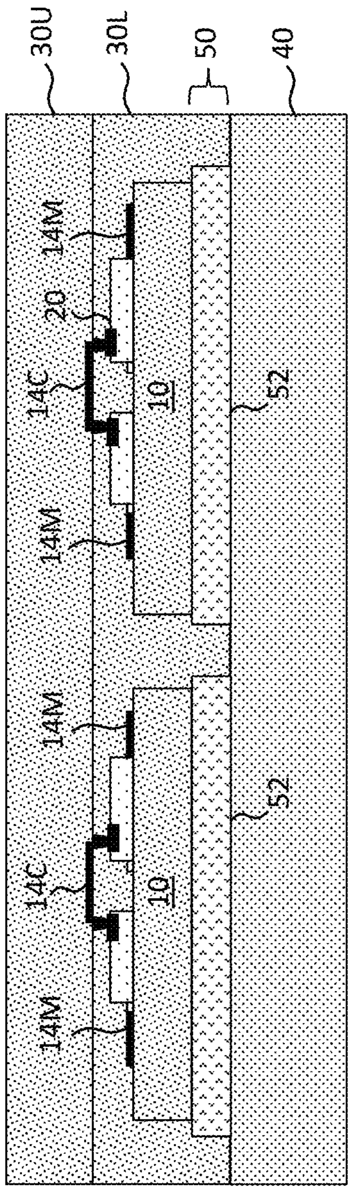
Figure 10J:
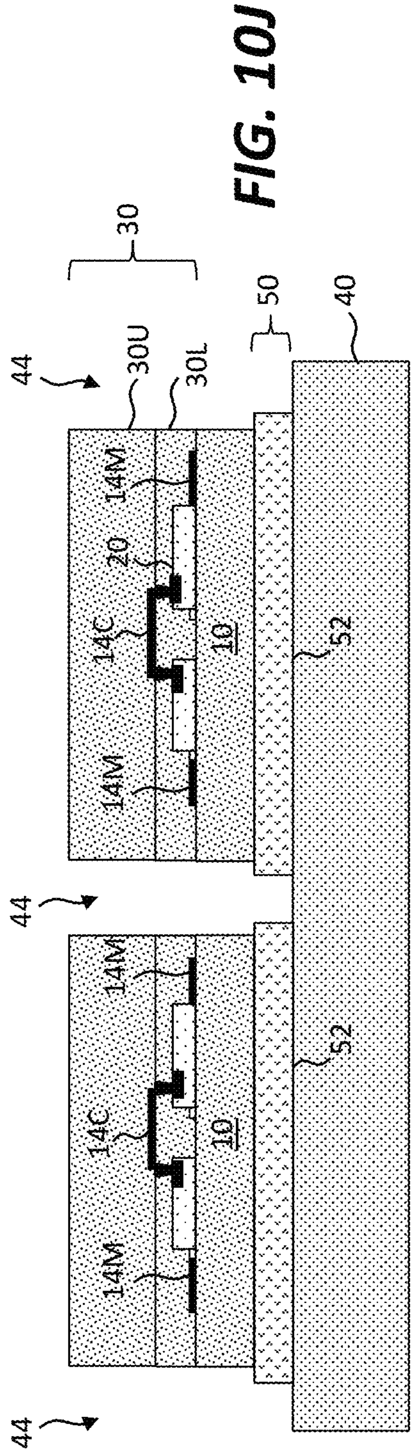
Figure 10K:
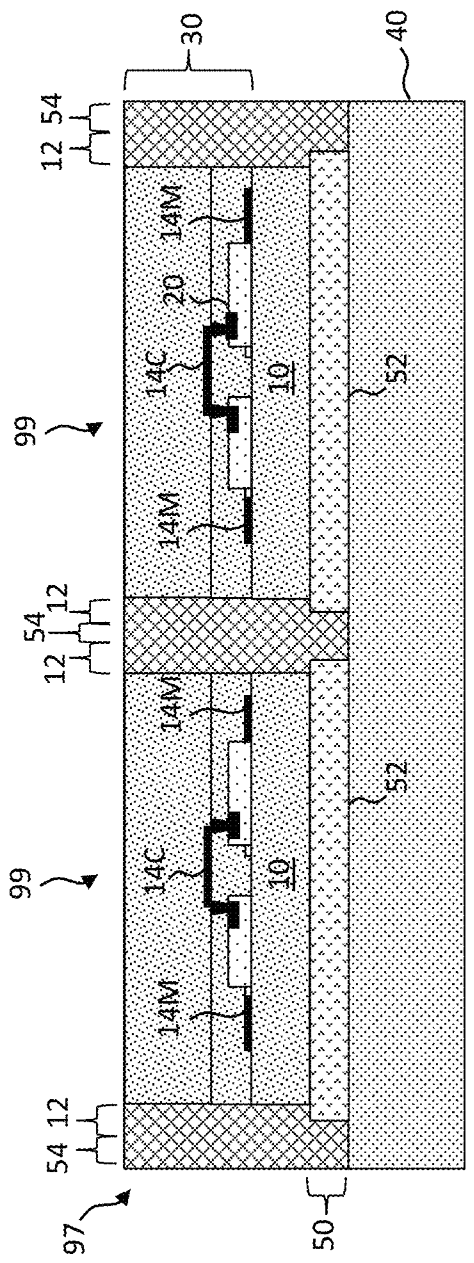
Figure 10L:
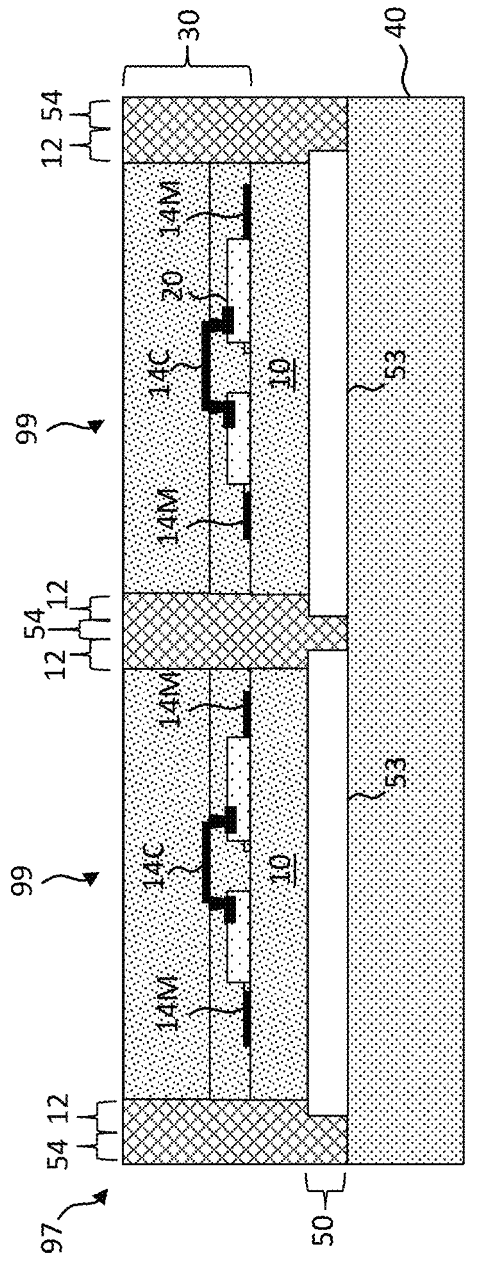
Figure 10M:
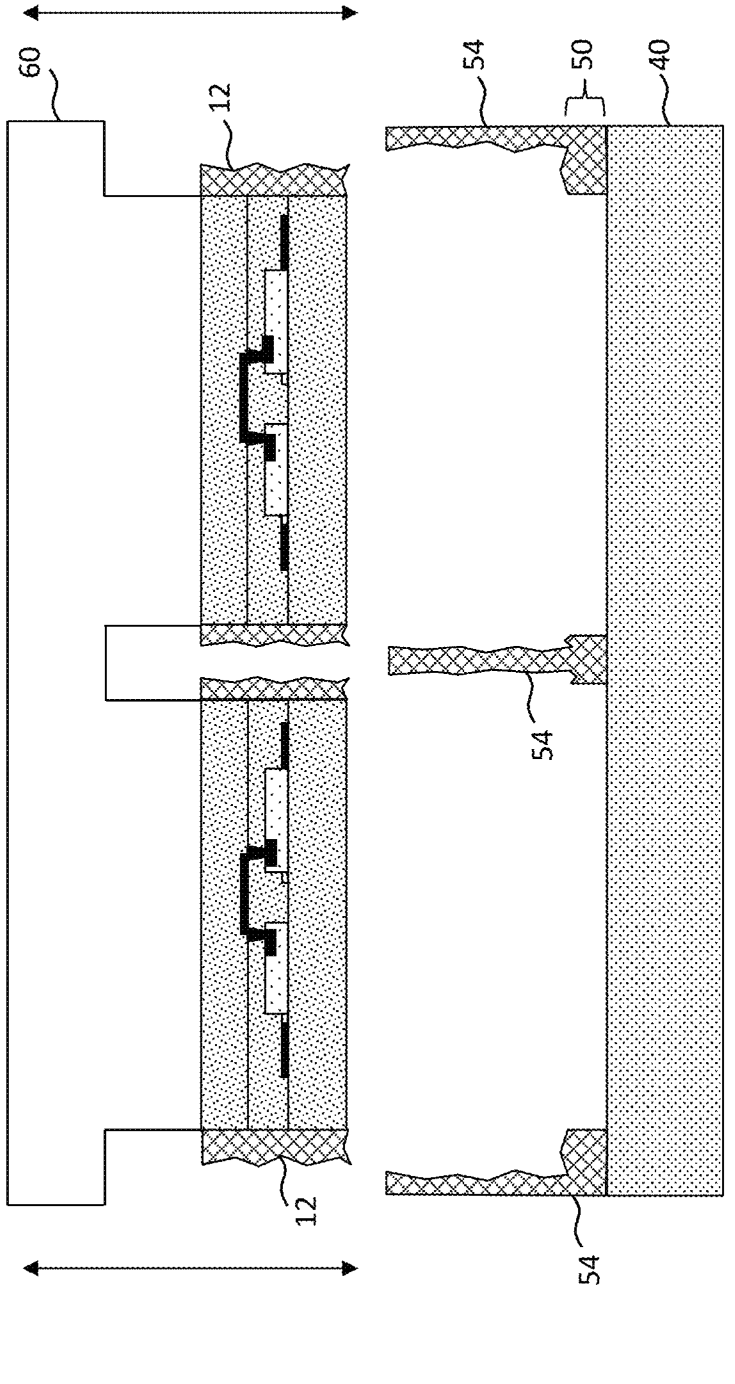
Figure 10N:
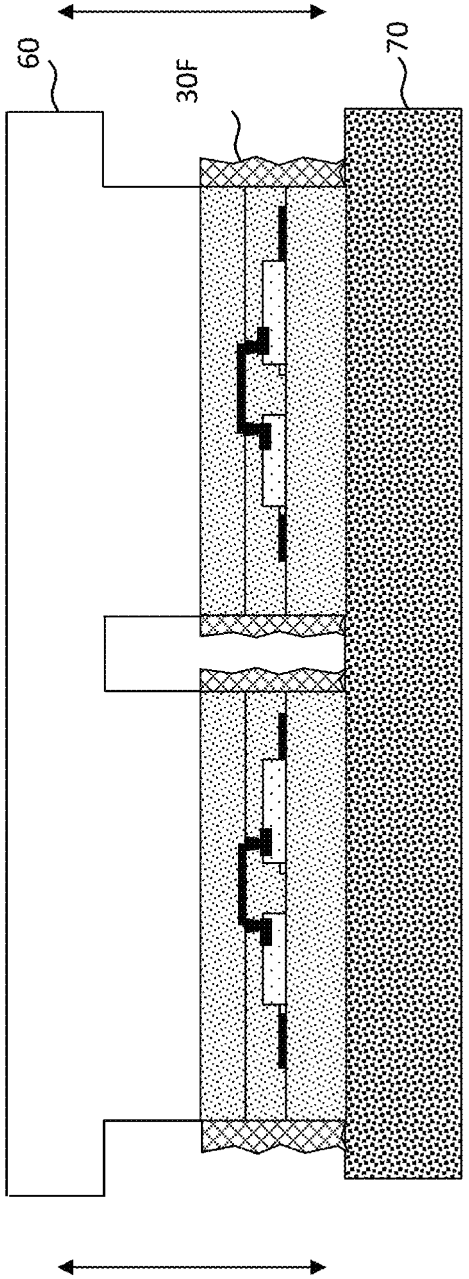
Figure 10O:
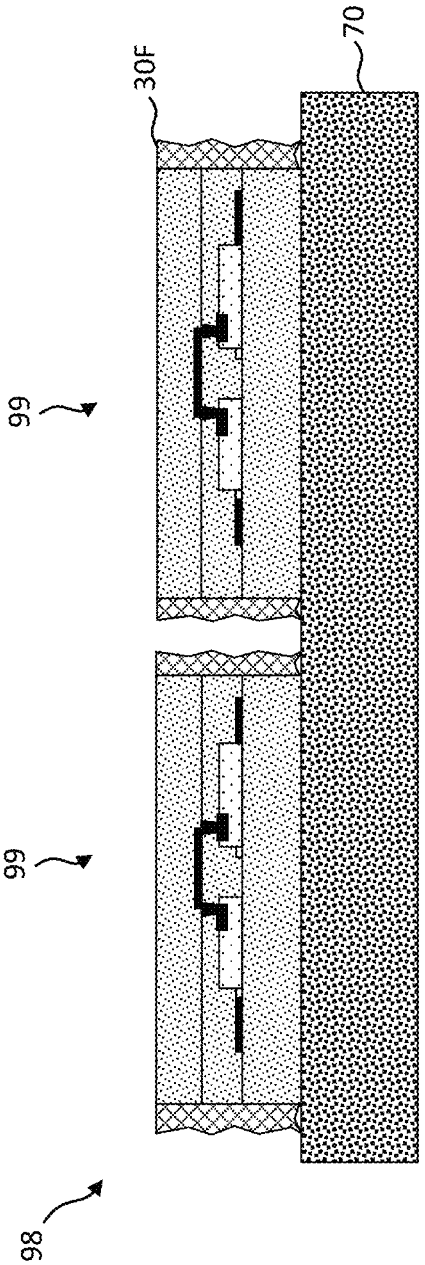
Figure 11:
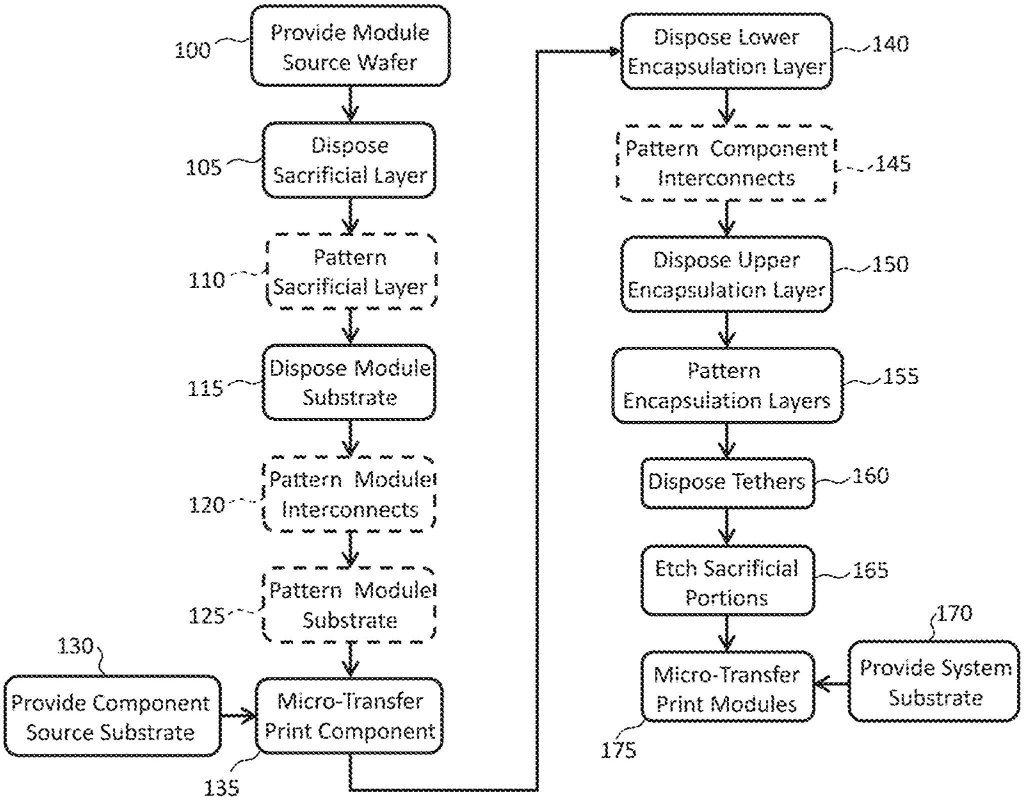
FIG. 11 is a flow diagram showing methods and structures according to illustrative embodiments of the present disclosure.

According to embodiments of the present disclosure and as illustrated in the flow diagram of FIG. 11 and the sequential structures of FIGS. 10A-10O, micro-component modules 99 and micro-component module systems 98 can be constructed using photolithographic processes and micro-transfer printing. FIGS. 10A-10O have a greatly exaggerated height for illustrative clarity. Generally, the layers illustrated are very thin relative to their length or width. Referring to step 100 of FIG. 11 and FIG. 10A, a module source wafer 40 (a module source substrate 40) is provided. Module source wafer 40 can be, for example, a semiconductor, glass, polymer, ceramic, sapphire wafer or a wafer found in the integrated circuit or display industries and can have opposing substantially planar surfaces useful for photolithographic processing, material deposition, or micro-transfer printing. In step 105 and as shown in FIG. 10B, a sacrificial layer 50 is disposed on module source wafer 40, for example by evaporating a sacrificial material, such as germanium, over module source wafer 40. In step 115 a module substrate 10 is disposed on sacrificial layer 50, as shown in FIG. 10C, for example by spinning or spraying an organic material, such as a polyimide, over sacrificial layer 50. Module substrate 10 can be cured, completely or partially. Sacrificial layer 50 comprises materials that are selectively etchable with respect to module substrate 10 and module source wafer 40. Module substrate 10 can comprise multiple organic and inorganic module substrate layers 10A, 10B, for example relatively thicker polyimide layers alternating with relatively thinner silicon dioxide layers as shown in FIGS. 5A-5D and can enable selective etching by providing a suitable module substrate 10 layer adjacent to sacrificial layer 50.

Module substrate 10 and sacrificial layer 50 are both patterned and can be patterned together (for example in optional step 125) or separately, first in optional step 110 in which sacrificial layer 50 is patterned and then second in optional step 125 in which module substrate 10 is patterned, for example depending on which respective materials are used and available appropriate etchants. Module interconnections 14M can be disposed or patterned on module substrate 10 either before or after module substrate 10 and sacrificial layer 50 are patterned. For example, in step 120 module interconnections 14M can be disposed and patterned after module substrate 10 is deposited on sacrificial layer 50 in step 115 but before module substrate 10 and sacrificial layer 50 are patterned, as shown in FIG. 10D. In some embodiments, module interconnections 14M are patterned after either module substrate 10 is patterned or after sacrificial layer 50 is patterned in steps 110 or 125, or after both module substrate 10 and sacrificial layer 50 are patterned in steps 125 and 110 respectively. Step 120 and step 125 can be done in reverse order, step 110 can be done after step 120, and the deposition and patterning steps for module interconnections 14M can be separated in time by the module substrate 10 patterning in step 125. In some such embodiments, patterned module interconnections 14M are disposed on patterned module substrate 10, which is disposed on patterned sacrificial layer 50, as shown in FIG. 10E.

According to some embodiments and as shown in FIG. 10F and FIG. 11, a component source substrate is provided in step 130 and components 20 are transfer printed (e.g., micro-transfer printed) from the component source substrate to module substrate 10 in step 135. Because, in certain embodiments, components 20 can be micro-transfer printed, components 20 can comprise or be attached to a broken (e.g., fractured) or separated component tether 22. (Although not shown in the Figures, any of module interconnection 14M deposition, module interconnection 14M patterning, module substrate 10 patterning, or sacrificial layer 50 patterning can be done after or before components 20 are disposed on module substrate 10. Those knowledgeable in photolithographic materials and processes will understand that the various steps of FIG. 11 and as illustrated in FIGS. 10A-10O can be done in different orders to form similar structures and embodiments of the present disclosure are not limited by the embodiments described herein.)

If desired, an encapsulation layer 30, for example a lower encapsulation sublayer 30L, can be disposed on or over module substrate 10 and over or on (e.g., directly over or on and in contact with) component(s) 20, for example as shown in FIG. 10G, in step 140, and can be disposed in separate lower and upper encapsulation sublayers 30L, 30U. If component interconnections 14C are desired, they can be formed over lower encapsulation sublayer 30L and can electrically connect to component contact pads 24 on components 20 through interconnection vias 34, as shown in FIG. 10H in step 145. As shown in FIG. 10I, in step 150 upper encapsulation sublayer 30U is disposed over lower encapsulation sublayer 30L and any component interconnection 14C or interconnection vias 34 on or in lower encapsulation sublayer 30L. If no component interconnections 14C or component interconnections 14C encapsulation are desired, a single coating of encapsulation layer 30 can suffice to encapsulate micro-component module 99. Encapsulation layer 30 can comprise an organic material, for example the same material as a material of module substrate 10, for example a polyimide, and can be spin or spray coated over component 20 and module substrate 10 and partially or completely cured. In step 155 and as shown in FIG. 10J, encapsulation layer 30 is patterned with an opening 44 that extends down to module source wafer 40. In some embodiments, module substrate 10 and sacrificial layer 50 can be patterned after encapsulation layer 30 is disposed and patterned, rather than in steps 110, 125 as illustrated in FIG. 11. Any of the etch steps can be performed by etching methods known in the photolithographic art, for example a dry etch, for example exposure to a plasma such as an oxygen plasma. Those skilled in photolithographic methods will understand that the patterning steps can be done at different steps in the overall process flows of embodiments of the present disclosure, and the disclosure is not limited by any particular embodiment.

In some embodiments comprising module tether 12, once encapsulation layer 30, module substrate 10, and sacrificial layer 50 are patterned to expose module source wafer 40 with opening 44, opening 44 is filled with an organic or inorganic material, e.g., a silicon oxide or silicon nitride material, in step 160 to form anchor/tether structures 54, 12 as shown in FIG. 10K. In embodiments of the present disclosure that do not require an anchor/tether structure 54, 12, step 160 can be omitted. Sacrificial portions 52 are etched to release components 20 in step 165 and as shown in FIG. 10L, for example by exposure to $H_2O_2$ 30% or other etchants suitable for the material of sacrificial portions 52, leaving components 20 attached to module source wafer 40 with anchor/tether structures 54, 12. Thus, according to embodiments of the present disclosure, a micro-component module source wafer 97 comprises a module source wafer 40, a sacrificial layer 50 comprising sacrificial portions 52 laterally separated by anchors 54 disposed on module source wafer 40 or forming a layer of module source wafer 40, a micro-component module 99 disposed entirely on and directly over each sacrificial portion 52, and a module tether 12 connecting each micro-component module 99 to an anchor 54.

Micro-component modules 99 can be micro-transfer printed from module source wafer 40 with a stamp 60 by contacting stamp 60 to components 20 to adhere micro-component modules 99 to stamp 60, removing stamp 60 and micro-component modules 99 from module source wafer 40, thereby fracturing module tether 12 (shown in FIG. 10M with a greatly exaggerated height for illustrative clarity), transferring stamp 60 and components 20 to a system substrate 70, and contacting components 20 to system substrate 70 (provided in step 170) with stamp 60 (shown in FIG. 10N), and removing stamp 60, leaving components 20 adhered to system substrate 70, in step 175 and as shown in FIG. 10O. Optionally, a flexible adhesive layer is disposed on system substrate 70 before disposing components 20 on system substrate 70. Optionally, micro-component modules 99 are encapsulated on system substrate 70 with a flexible encapsulation layer 30, for example by laminating a sheet (e.g., a polymer or paper sheet) over components 20 and system substrate 70 or by inverting micro-component module system 98 and laminating the inverted micro-component module system 98 onto the sheet. For example, system substrate 70 can be a foil or thread that is laminated onto a sheet that is a banknote or other security document.

Figure 12:
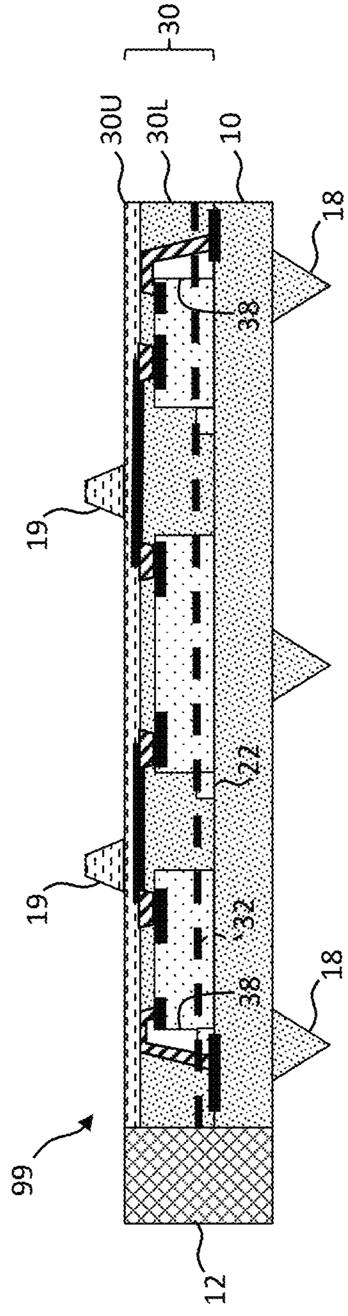
FIG. 12 is a schematic cross section of micro-component module with anti-stiction structures (e.g., spikes) according to illustrative embodiments of the present disclosure.

As shown in FIG. 12, step 155 can comprise roughening or patterning a surface of encapsulation layer 30, as well as forming opening 44, for example to form anti-stiction structures 19. Such a roughened or patterned surface of encapsulation layer 30 is on a side of encapsulation layer 30 opposite module substrate 10 and can define a non-planar topography that is or has anti-stiction structures 19 that help to prevent micro-component modules 99 from sticking to each other when removed from module source wafer 40. The surface of encapsulation layer 30 can have such a topography as a result of coating module substrate 10, components 20, component interconnection 14C, each of which can have a different height or thickness over module substrate 10. In some embodiments, an exposed surface of encapsulation layer 30 can have such a topography as a result of exposing encapsulation layer 30 to a roughening agent such as an etchant or plasma, such as an oxygen plasma. In some embodiments, an exposed surface of encapsulation layer 30 can have such a topography as a result of photolithographic methods and materials intended to form structures, such as masking the surface, exposing the unmasked portions of the surface to an etchant, and stripping the mask to form defined anti-stiction structures 19, as shown in FIG. 12. Anti-stiction structures 19 can protrude, extend, or stick out from a surface of encapsulation layer 30 in a direction opposite module substrate 10 and can help to prevent micro-component modules 99 from sticking to each other or other surfaces or structures when removed from module source wafer 40.

Figure 13A:
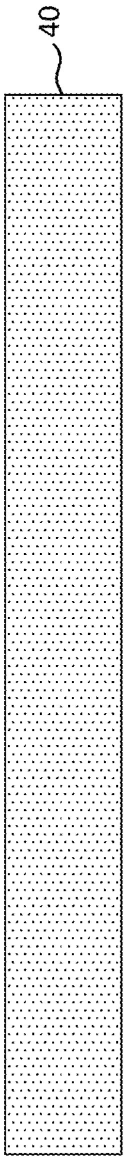
FIGS. 13A-13E are successive schematic cross sections illustrating exemplary methods and micro-component module structures in the construction of exemplary micro-component modules according to illustrative embodiments of the present disclosure.
Figure 13B:
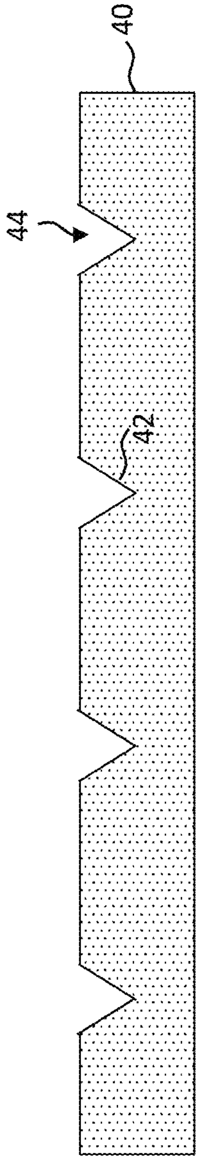
Figure 13C:
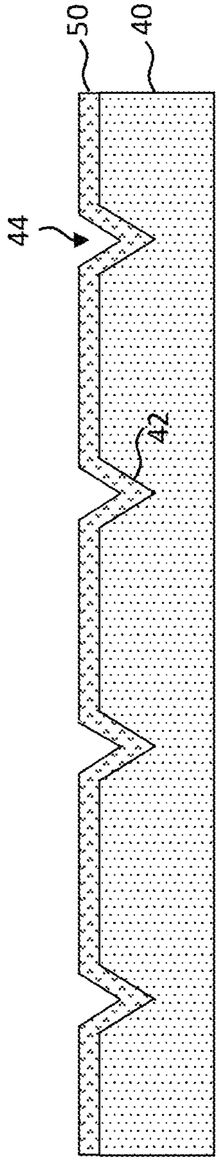
Figure 13D:
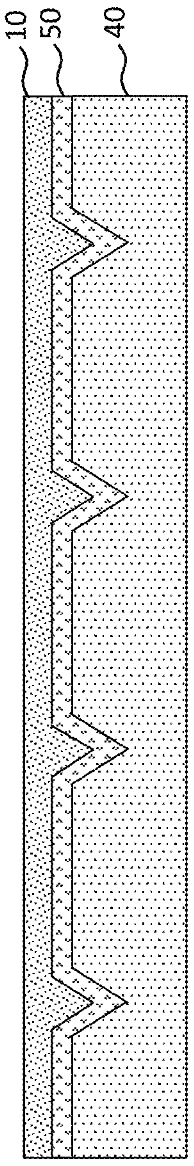
Figure 13E:
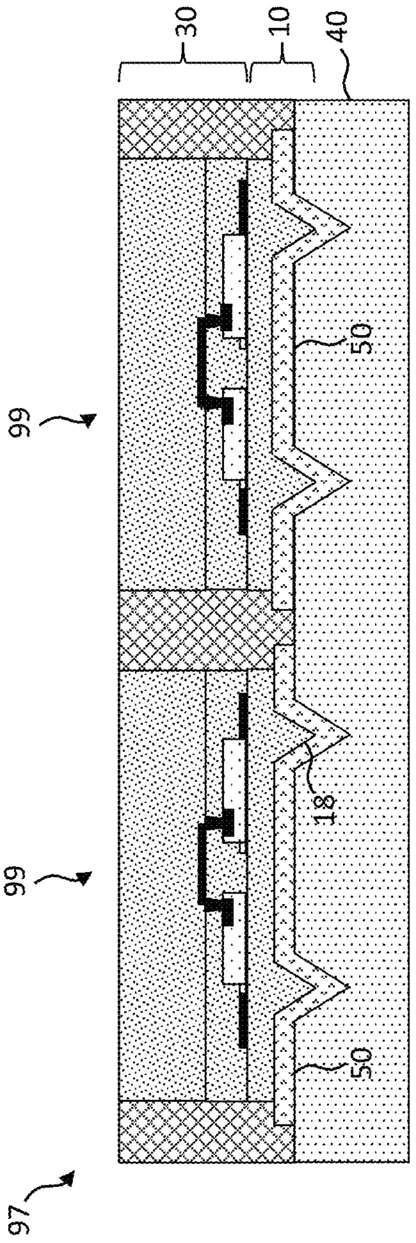

As also shown in FIG. 12, anti-stiction spikes 18 can protrude, extend, or stick out from a surface of module substrate 10 opposite component 20 and also help to prevent micro-component modules 99 from sticking to each other when removed from module source wafer 40. Spikes 18 can be anti-stiction structures. As shown in FIGS. 13A-13E, spikes 18 can be formed by providing a module source wafer 40 (illustrated in FIG. 13A and equivalent to FIG. 10A in step 100) and making forms 42 in module source wafer 40 (illustrated in FIG. 13B). Forms 42 can have any shape made, for example, by photolithographic processing such as masked etching. In some embodiments, module source wafer 40 comprises crystalline materials (e.g., silicon) having planes that can be etched to form pyramidal structures. The structured surface of module source wafer 40 is coated with sacrificial layer 50, as illustrated in FIG. 13C and equivalent to FIG. 10B in step 105. As illustrated in FIG. 13D, a material of module substrate 10 is coated over structured sacrificial layer 50 (in step 115 and equivalent to FIG. 10C) and forms both spikes 18 and module substrate 10. Thus, spikes 18 and module substrate 10 can be or comprise a common material and can be a single unified structure. The remainder of the structures 10D-10O are constructed as described in steps 110 and 120 to 175. FIG. 13E illustrates a structure equivalent to FIG. 10K having a structured module substrate 10.

Figure 14A:
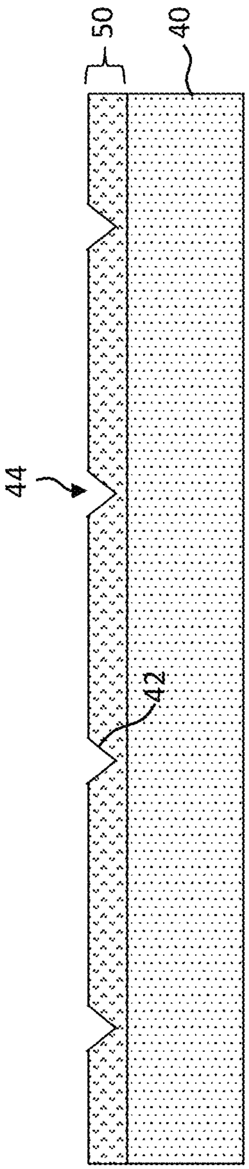
FIGS. 14A-14B are successive schematic cross sections of micro-component modules and wafers according to illustrative embodiments of the present disclosure.
Figure 14B:
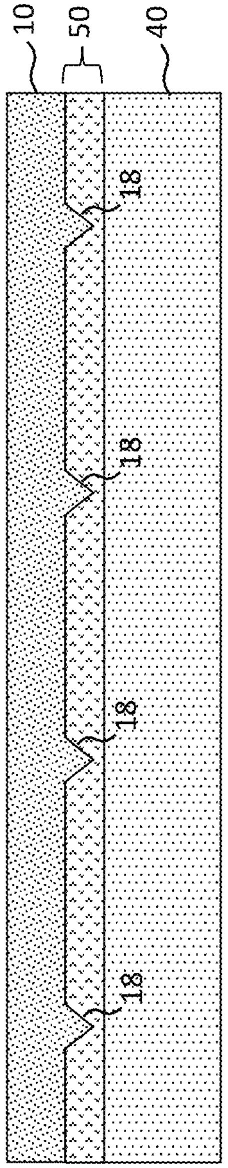
Figure 15:
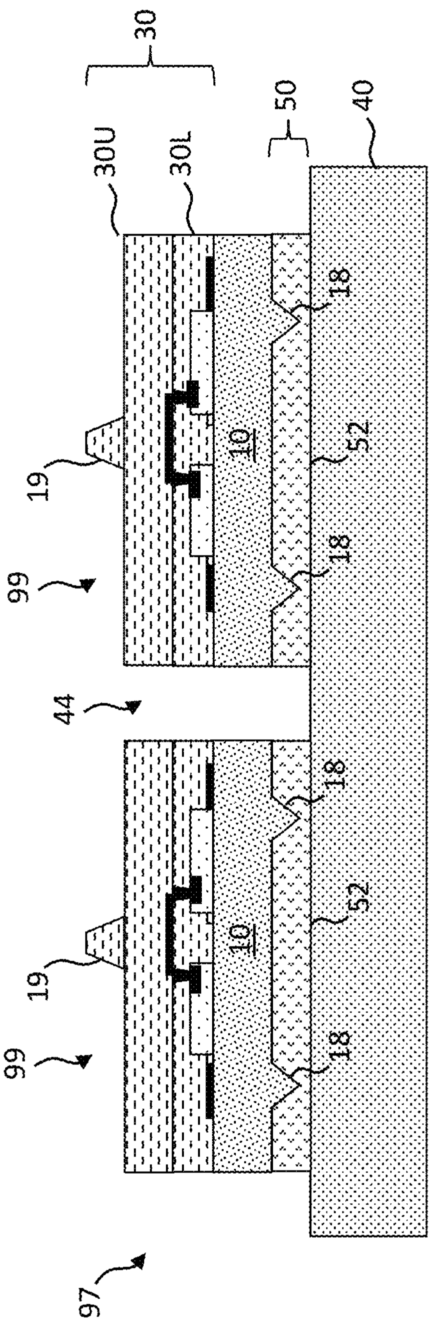
FIG. 15 is a schematic cross section illustrating exemplary methods and micro-component module structures in the construction of exemplary micro-component modules according to illustrative embodiments of the present disclosure.

As shown in FIGS. 14A and 14B, a structured module substrate 10 with anti-stiction spikes 18 can be constructed by coating module source wafer 40 with sacrificial layer 50 (as shown in FIGS. 10A and 10B in steps 100 and 105), and then forming structures in sacrificial layer 50, for example using photolithographic processing such as masked etching as illustrated in FIG. 14A. The structured sacrificial layer 50 is then coated with module substrate 10 (e.g., as shown in FIG. 10C in step 115). Successive structures corresponding to FIGS. 10D-10O can be made as described with respect to the flow diagram of FIG. 11. FIG. 15 illustrates spikes 18 and anti-stiction structures 19 in micro-component modules 99 of micro-component module source wafer 97 separated by openings 44 (corresponding to FIG. 10J and step 155).

FIG. 15 also illustrates embodiments in which micro-component modules 99 are not micro-transfer printed but are rather completely released from module source wafer 40 when sacrificial portions 52 are etched so that micro-component modules 99 are not attached with module tethers 12 to anchors 54. Micro-component modules 99 can be removed from module source wafer 40, or example by washing module source wafer 40, by blowing jets of gas onto micro-components 99, or by inverting module source wafer 40 so that micro-component modules 99 fall away from module source wafer 40 under the influence of gravity, for example onto a system substrate 70. Anti-stiction structures 19 and spikes 18 can facilitate separation between module source wafer 40 and micro-component modules 99 by keeping them from sticking together.

Figure 16A:
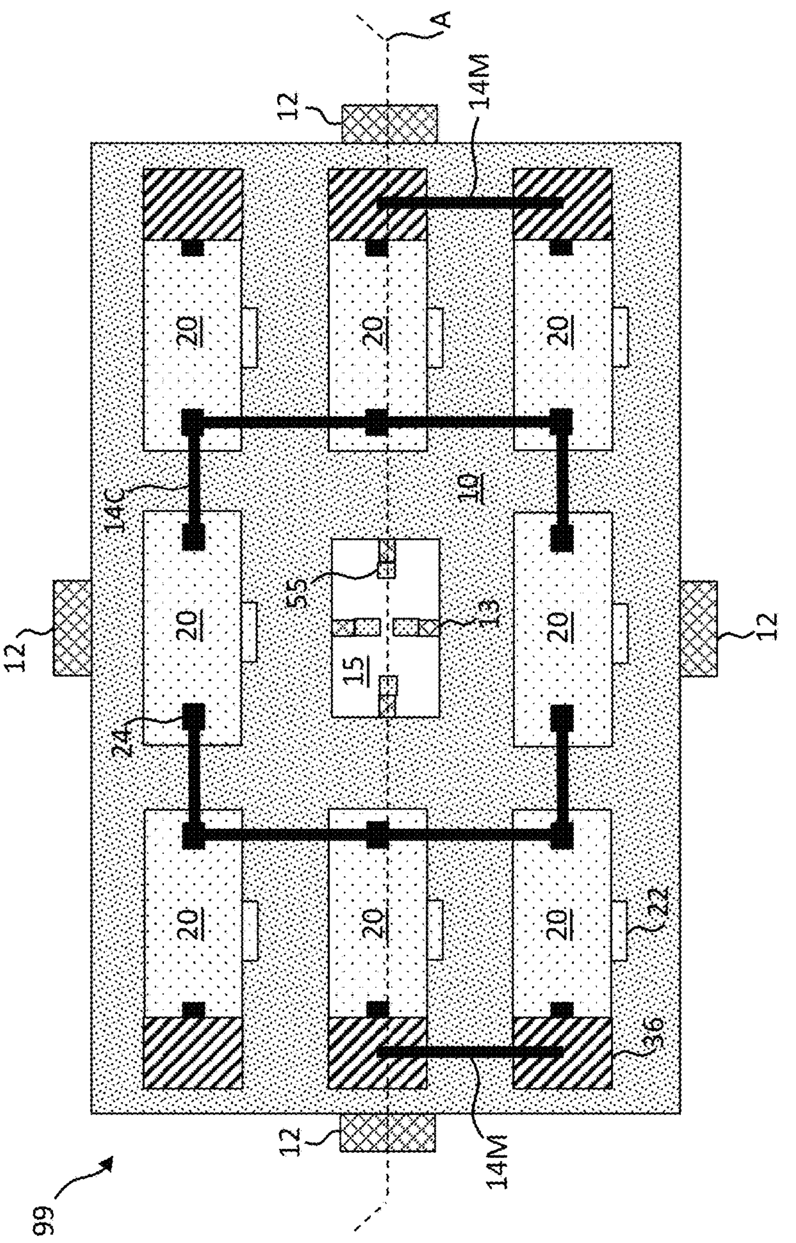
FIG. 16A is a schematic plan view and FIG. 16B is a corresponding cross section taken along cross section line A of FIG. 16A illustrating internal module cavities and internal module tethers according to illustrative embodiments of the present disclosure.
Figure 16B:
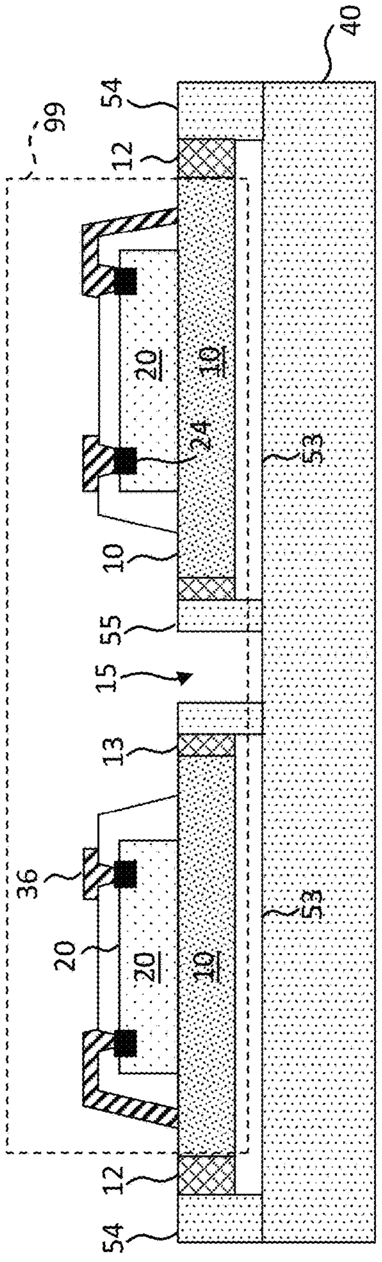
Figure 18A:
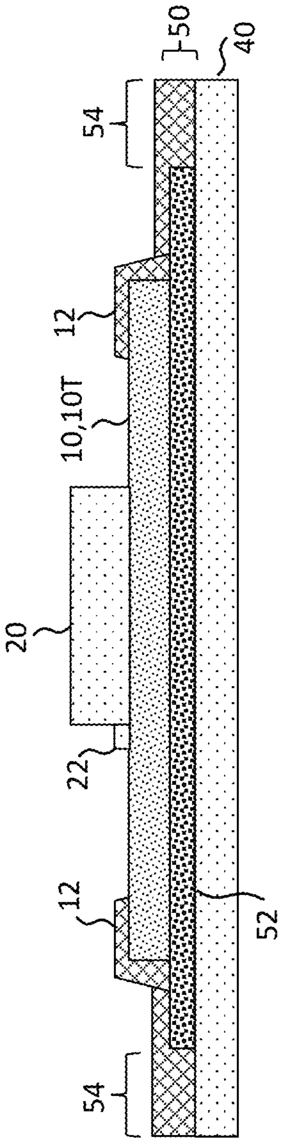
FIGS. 18A-18B are cross sections of micro-component source wafers useful in understanding embodiments of the present disclosure.
Figure 18B:
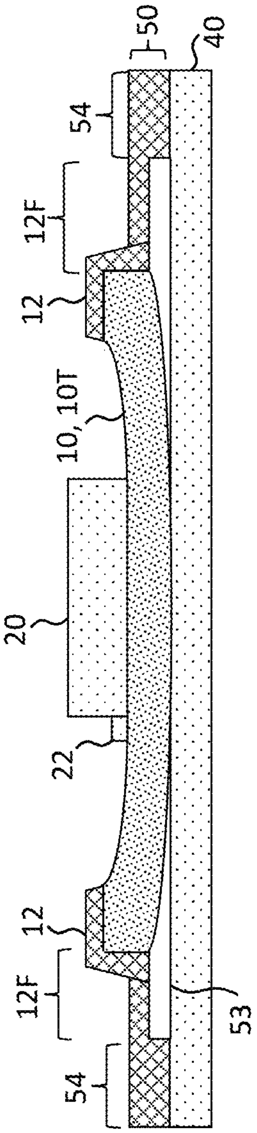

The schematic plan view of FIG. 16A and corresponding cross section of FIG. 16B (where FIG. 16A excludes module source wafer 40 for clarity) illustrate embodiments of the present disclosure in which micro-component module 99 incorporates an internal module cavity 15. Internal module cavity 15 is an opening in module substrate 10 where no part of micro-component module 99 is present so that internal module cavity 15 is a hole or void of arbitrary shape and size (less than a size of module substrate 10) in module substrate 10. Internal module cavity 15 extends entirely and all of the way through module substrate 10. As shown in FIG. 16A, components 20, interconnections 14, and electrodes 36 can be disposed on module substrate 10 around internal cavity module 15. In embodiments in which micro-component module 99 is relatively large, for example having a length or width no less than 250 microns, 500 microns, 750 microns, or 1 mm and a flexible module substrate 10, after undercutting the micro-component module 99 by etching sacrificial portions 52 leaving a gap 53 between micro-component module 99 and module substrate 40 (e.g., after step 165 of FIG. 11), flexible module substrate 10 can sag into gap 53, possibly touching module substrate 40 or causing stiction between module substrate 10 and module substrate 40 and making retrieval of micro-component module 99 by stamp 60 more difficult, as shown in FIG. 18B, discussed below. Internal module tethers 13 connected to flexible module substrate 10 and internal anchors 55 can be provided in internal module cavity 15 to support micro-component module 99 and prevent micro-component module 99 from sagging into gap 53 and causing stiction between module substrate 10 and module substrate 40. Internal module tethers can have the same attributes, construction, and materials as module tethers 12 (e.g., more brittle than module substrate 10). Although not shown in FIG. 16B, spikes 18 can additionally be used to support module substrate 10 and prevent contact with module substrate 40. Internal module cavity 15 can also facilitate etching sacrificial portions 52, with or without internal module tethers 13 and internal anchors 55. Thus, in some embodiments, module substrate 10 comprises internal module cavity 15 even if no internal module tethers 13 are present. When micro-component module 99 is relatively large, etching all of sacrificial portion 52 under each micro-component module 99 can take longer than desired, slowing manufacturing processes and exposing micro-component module 99 and anchors 54 to an etchant for longer than can be desired and possibly harming them. By providing ingress for an etchant through internal module cavity 15 to sacrificial portion 52, etching time can be reduced, speeding manufacturing processes and reducing micro-component module 99 and anchor 54 exposure to the etchant, reducing costs and increasing micro-component module 99 reliability.

Therefore, in some embodiments of the present disclosure, a micro-component module 99 comprises module substrate 10 with components 20 disposed on module substrate 10. Module substrate 10 comprises an internal module cavity 15 surrounded by module substrate 10. In some embodiments, internal module tethers 13 in internal module cavity 15 physically connect module substrate 10 to internal anchors 55 in internal module cavity 15. Micro-component module 99 can be encapsulated, leaving open internal module cavity 15 or micro-component 99 can be completely encapsulated after micro-component module 99 is disposed on system substrate 70.

Figure 17A:
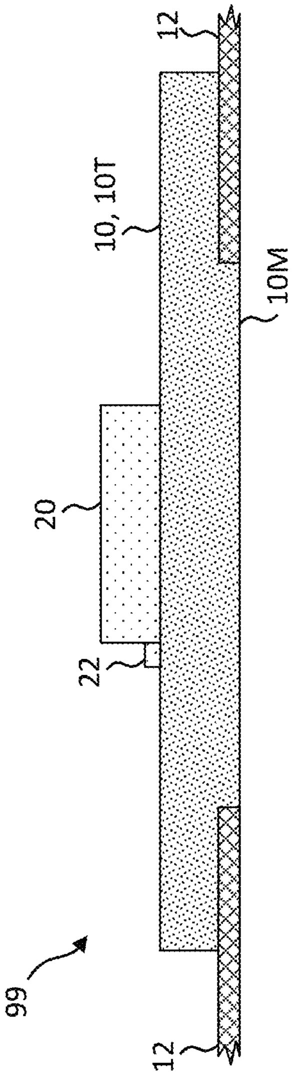
FIGS. 17A-17G are cross sections of module tether and layer structures according to illustrative embodiments of the present disclosure.
Figure 17B:
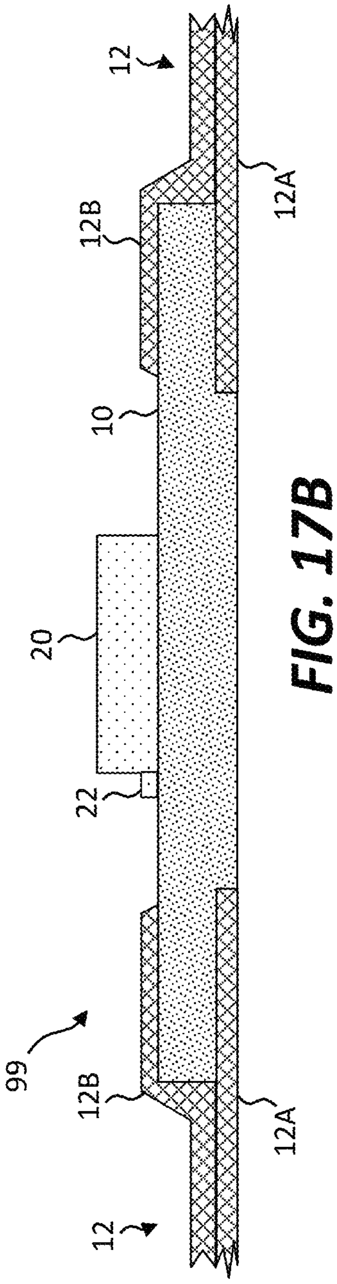

According to embodiments of the present disclosure and as illustrated in FIG. 17A, a useful module tether 12 for micro-component module 99 with a flexible module substrate 10 can extend on only a portion of a bottom side 10M of module substrate 10 opposite component 20 disposed on a top side 10T of module substrate 10, e.g., module tether 12 extends beneath only a portion of module substrate 10 and extends beyond module substrate 10. As will be appreciated by those knowledgeable in the art, the terms over and under, above and below, and top and bottom are relative terms that can be exchanged depending on a perspective of an observer. Component 20 can comprise a broken component tether 22 as a consequence of micro-transfer printing component 20 from a component source wafer to module substrate 10. Module tether 12 can be broken (e.g., fractured) or separated as a consequence of micro-transfer printing micro-component module 99 from a component source wafer to module substrate 10. Thus, according to embodiments, a micro-component module 99 can comprise module substrate 10 having a top side 10T and an opposing bottom side 10M and component 20 disposed on top side 10T of module substrate 10. Module substrate 10 is flexible, e.g., module substrate 10 is relatively more flexible than relatively more rigid component 20. Module tether 12 extends beyond module substrate 10 and module tether 12 also extends beneath at least a portion of module substrate 10. Module tether 12 can provide mechanical support to module substrate 10. Micro-component module 99 can comprise multiple (e.g., two or more) module tethers 12, e.g., broken (e.g., fractured) or separated module tethers 12, that can be disposed around a perimeter of micro-component module 99, for example disposed symmetrically or regularly around the perimeter. In some embodiments, and as shown in FIG. 17B, each of the two or more module tethers 12 extends beyond module substrate 10 and extends beneath only a portion of module substrate 10.

The portion of module tether 12 extending below module substrate 10 can be important to providing stability to module substrate 10 during micro-component module 99 release and printing from micro-component module source wafer 97. FIGS. 18A-B show a comparative example with reduced performance when module tether 12 does not extend beneath any portion of module substrate 10. As shown in FIG. 18A, sacrificial portions 52 separated by anchors 54 of a sacrificial layer 50 comprising a source wafer (e.g., module source wafer 40) with micro-transfer printable micro-component modules 99 disposed on a top surface of the source wafer can comprise an etchable material. Module substrate 10 is disposed entirely over and directly on (e.g., in direct contact with) sacrificial portion 52 and physically connected to anchors 54 with module tethers 12. If module substrate 10 is flexible and module tether 12 extends only on top side 10T of module substrate 10, when etchable sacrificial portion 52 is etched to form a gap 53 (e.g., a volume that is not filled with a solid or liquid material and is either a vacuum or filled with a gas, such as atmosphere or an inert gas such as nitrogen), module substrate 10 can sag into gap 53 under the influence of gravity, capillary, or surface adhesion forces (such as electrostatic surface adhesion forces), as shown in FIG. 18B. Over time, flexible module substrate 10 and module source wafer 40 can come into intimate physical contact and result in stiction between flexible module substrate 10 and module source wafer 40. This stiction can inhibit or even prevent the removal of flexible module substrate 10 from module source wafer 40 by micro-transfer printing with a stamp 60. For example, under these circumstances the forces attracting module substrate 10 of micro-component module 99 to module source wafer 40 can be greater than the forces adhering micro-component module 99 to a stamp 60.

Figure 19:
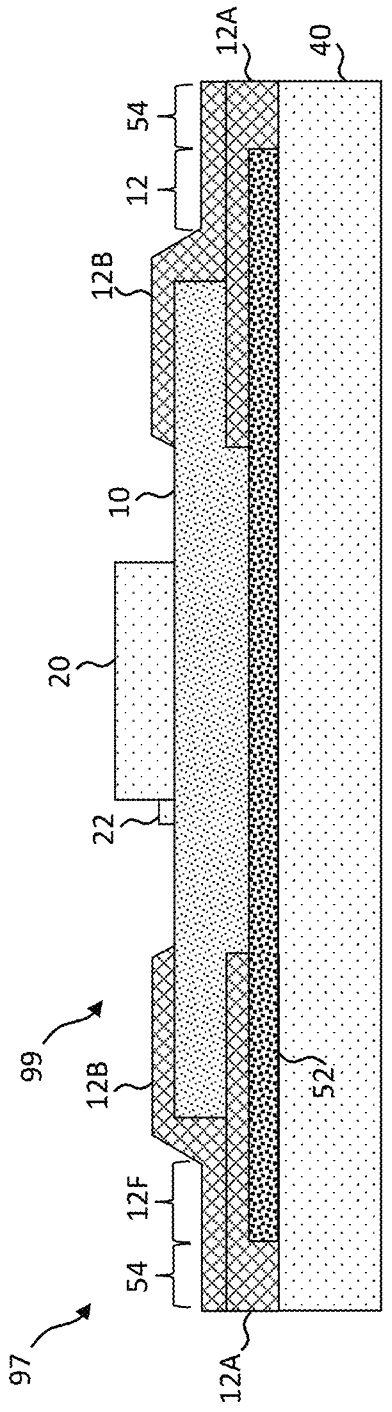
FIGS. 19 and 20 are cross sections of micro-component module source wafers according to illustrative embodiments of the present disclosure.
Figure 20:
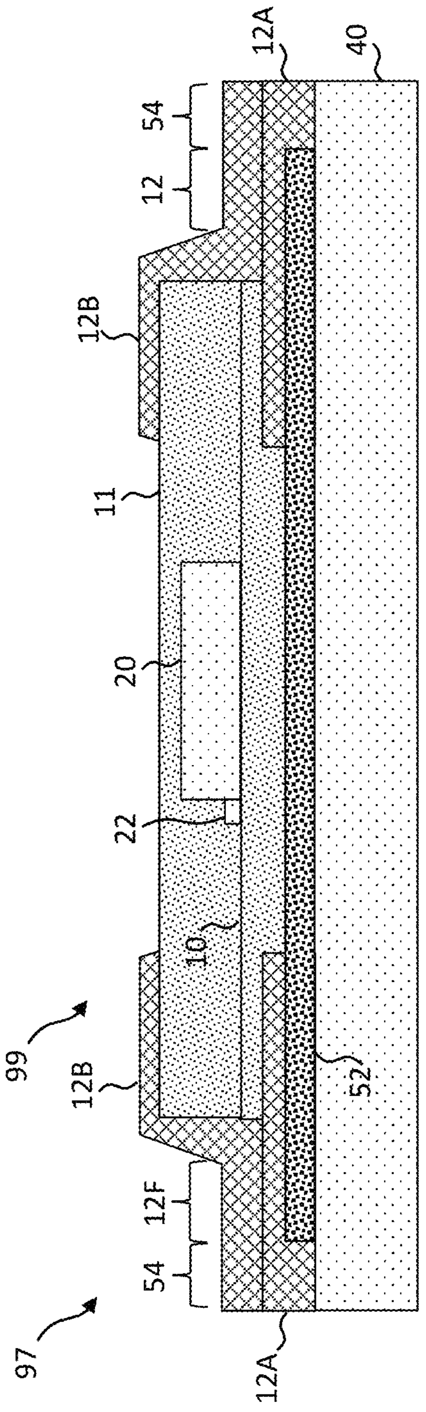
Figure 21:
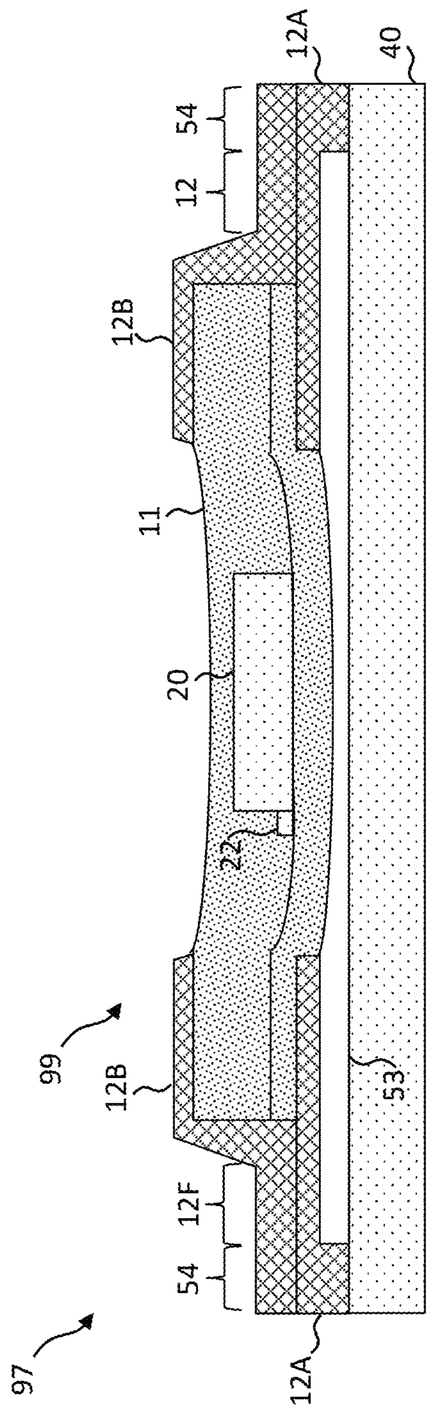
FIG. 21 is a cross section of a micro-component module source wafer with a micro-component disposed over a gap according to illustrative embodiments of the present disclosure.

According to embodiments of the present disclosure and as illustrated in FIGS. 17A-17D and 19-21, module tether 12 extends beyond module substrate 10 and extends beneath only a portion of module substrate 10. Module tether 12 does not extend entirely beneath flexible module substrate 10 because if module tether 12 did extend entirely beneath module substrate 10, module tether 12 would effectively be a non-flexible (or at least more rigid) layer of module substrate 10 rendering module substrate 10 less flexible, which is undesirable for certain applications. However, module tether 12 extends under only a portion of module substrate 10 to support module substrate 10 and prevent, inhibit, or reduce stiction between module substrate 10 and module source wafer 40, for example as shown in FIG. 21 where sacrificial portion 52 is etched to form gap 53. Rigidity of module tether 12, for example when it is made of an inorganic material, can therefore act to stabilize module substrate 10 while micro-component module 99 is on module source wafer 40 without interfering significantly with flexibility of module substrate 10 once printed (e.g., because module tether 12 extends under only a portion of module substrate 10).

Furthermore, rigidity of module tether 12 can also promote breakage (e.g., fracturing) of the tether during printing to facilitate high fidelity printing, whereas a tether made of flexible material may not break (e.g., fracture) at least under equivalent printing conditions (e.g., applied pressure and/or stamp speed after adhesion). Module tether 12 also extends beyond flexible module substrate 10 and physically attaches module substrate 10 to anchor 54 so that module tether 12 can break (e.g., fracture) when micro-component module 99 is removed from module source wafer 40 by stamp 60 during micro-transfer printing, as indicated by module tether fracture area 12F. A flexible material, such as polyimide, used in module substrate 10 is difficult to fracture and therefore it is preferred that module tether 12 does not comprise any portion of flexible module substrate 10. A breakable (e.g., fracturable) portion of module tether 12 extends beyond flexible module substrate 10 to anchor 54 in a direction parallel to a major surface of module substrate 10 and the extent of module source wafer 40. Module tether 12 can be more rigid than module substrate 10. For example, module tether 12 can comprise an inorganic material, for example an oxide, such as silicon dioxide, or a nitride, such as silicon nitride, and module substrate 10 can comprise an organic material such as a polymer, for example a polyimide.

FIG. 17A illustrates embodiments of the present disclosure in which only a portion of module tether 12 is disposed beneath only a portion of bottom side 10M of module substrate 10 and there is no portion of module substrate 10 directly beneath module tether 12 so that a portion of module tether 12 is in direct contact with sacrificial portion 52 (prior to etching), for example as shown in FIGS. 19-20.

As shown in FIG. 17B, in some embodiments module tether 12 comprises two module tether layers 12A and 12B (together forming module tether 12). Module tether layer 12A extends beneath module substrate 10 along its bottom side 10M and module tether layer 12B extends on a top side 10T of module substrate 10. In some embodiments where module tether 12 comprises multiple layers, module tether 12 extends on only a portion of top side 10T of module substrate 10. In some embodiments where module tether 12 comprises multiple layers, module tether 12 extends beneath only a portion of bottom side 10M of module substrate 10. Module tether layers 12A and 12B can comprise a same material or different materials, for example inorganic materials such as silicon dioxide or silicon nitride. By "sandwiching" module substrate 10 between layers forming module tether 12, additional stability can be imparted to module substrate that is particularly useful for especially flexible module substrates 10, such as polyimide substrates.

Figure 17C:
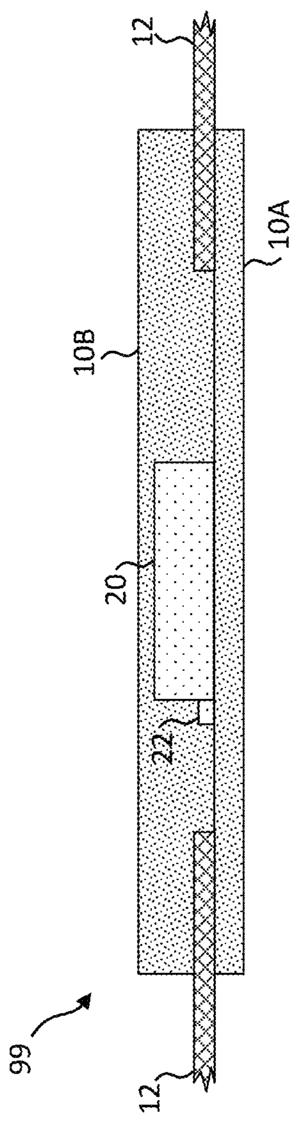

In some embodiments, and as illustrated in FIG. 17C, flexible module substrate 10 can comprise multiple layers, for example two module substrate layers 10A and 10B. Module substrate layer 10A is disposed directly beneath a portion of module tether 12 and module substrate layer 10B is disposed directly over module substrate layer 10A and can, for example encapsulate component 20 (e.g., as shown in FIG. 17G), providing environmental protection to component 20. In some such embodiments, module tether 12 extends within only a portion of module substrate 10. Module substrate layer 10B can be a same material as module substrate layer 10A. Module substrate 10 can comprise only module substrate layer 10A or can comprise both module substrate layer 10A and an encapsulation layer 11, such as substrate layer 10B when disposed over component 20.

Figure 17D:
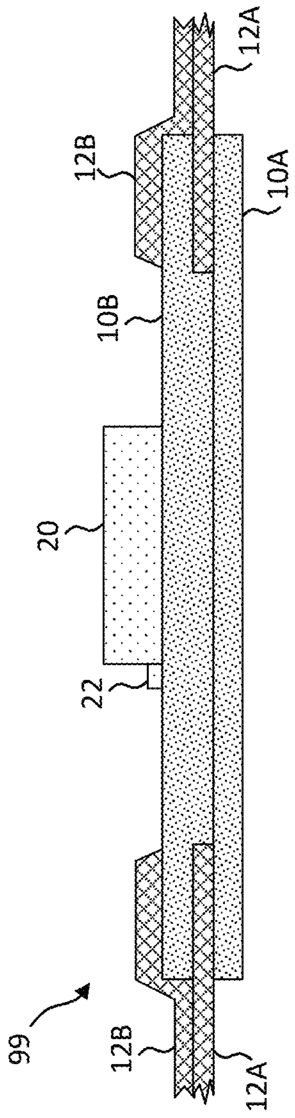

As shown in FIG. 17D, in some embodiments module substrate 10 comprises multiple layers, for example two module substrate layers 10A and 10B (collectively module substrate 10) and module tether 12 comprises two module tether layers 12A and 12B (collectively module tether 12). Module tether layer 12B extends on top side 10T of module substrate 10, as in FIG. 17B. Module tether layer 12A extends within only a portion of module substrate 10, as in FIG. 17C.

Figure 17E:
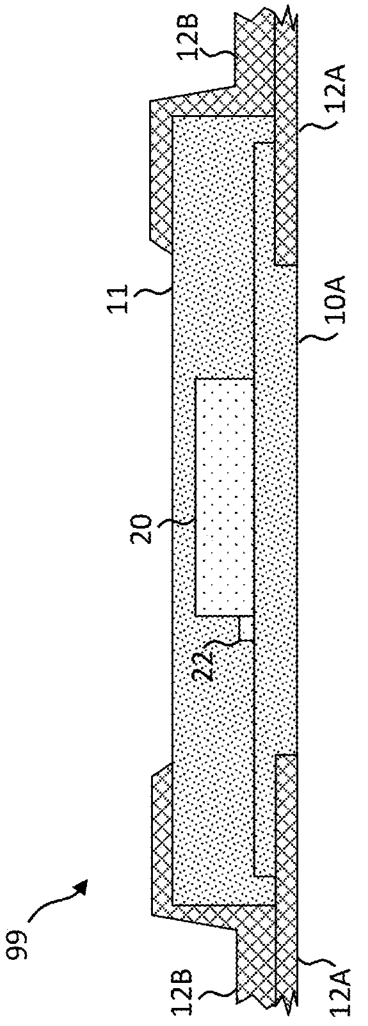

As shown in FIG. 17E, in some embodiments module substrate 10 comprises multiple layers, for example two module substrate layers 10A and 10B (collectively module substrate 10) and module tether 12 comprises two module tether layers 12A and 12B (collectively module tether 12). Module tether layer 12A extends beneath only a portion of module substrate 10 and module tether layer 12B extends on module substrate 10, as in FIG. 17B. In some embodiments, and as shown in FIG. 17E, a portion of module substrate 10 is coplanar with at least a portion of module tether 12 whether or not module tether 12 extends beneath only a portion of module substrate 10 (which it does in FIG. 17E).

Figure 17F:
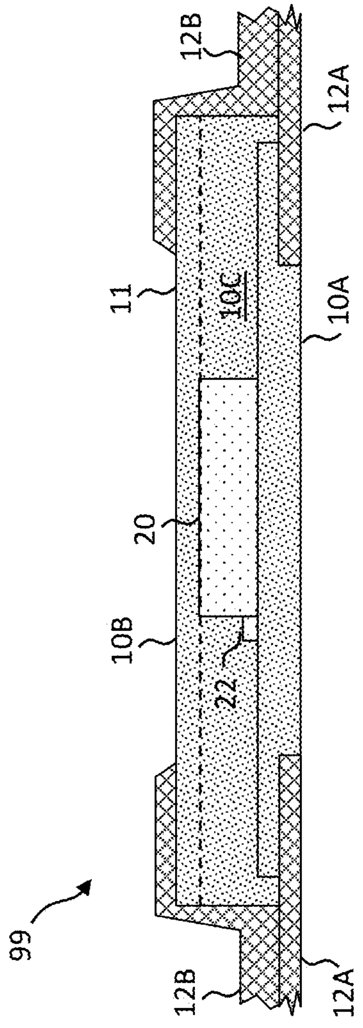
Figure 17G:
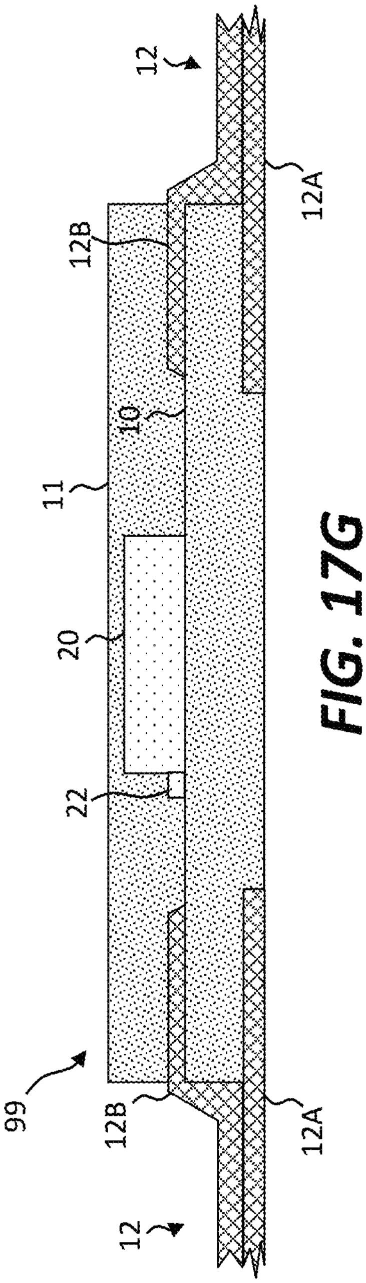

As shown in FIG. 17F, in some embodiments module substrate 10 comprises three module substrate layers 10A, 10B, 10C, (collectively module substrate 10), a layer beneath components 20 (e.g., module substrate layer 10A), a layer disposed over module substrate layer 10A planarizing components 20 (e.g., planarizing module substrate layer 10C, which enables certain wire interconnections between multiple components 20 with reduced step heights, for example as shown in FIG. 10H), and an encapsulating module substrate layer 10B disposed over planarizing module substrate layer 10C, components 20, and any wire interconnections (e.g., as shown in FIG. 10I). The planarizing module substrate layer 10C and encapsulating module substrate layer 10B can comprise a same material, or different materials or the same material as module substrate layer 10A.

As shown in FIG. 17G, in some embodiments module tether 12 comprises two module tether layers 12A and 12B (collectively module tether 12) and micro-component module 99 comprises encapsulation layer 11. Module tether layer 12B extends on only a portion of top side 10T of module substrate 10 and module tether layer 12A extends beneath only a portion of bottom side 10M of module substrate 10. Encapsulation layer 11 encapsulates component 20 and extends on only a portion of module tether 12 (e.g., only the portion of module tether 12 that extends on top side 10T of module substrate 10, as shown). As shown in FIGS. 19-21, according to illustrative embodiments of the present disclosure, a micro-component module source wafer 97 comprises a wafer (e.g., module source wafer 40) and a sacrificial layer 50 comprising sacrificial portions 52 laterally separated by anchors 54 disposed on module source wafer 40 or forming a layer of module source wafer 40. A module substrate 10 and component 20 is disposed directly on and entirely over each sacrificial portion 52. A module tether 12 is in physical contact with each module substrate 10 and is in physical contact with one of anchors 54, for example direct physical contact. In some embodiments, sacrificial portion 52 is etched to define a gap 53 between micro-component module 99 and wafer 40. According to embodiments of the present disclosure, sacrificial portion 52 is differentially etchable from module substrate 10. Sacrificial portion 52 can be, for example germanium and module substrate 10 can be a polyimide. As shown in FIG. 21, after sacrificial portion 52 is etched to form gap 53, module substrate 10 can be curved due to gravity or surface material forces but is not in contact with module source wafer 40, for example due to stability provided by rigidity of module tether(s) 12, and can experience no or reduced stiction with module source wafer 40.

Therefore, in some embodiments of the present disclosure a method of making micro-component module source wafer 97 comprises providing a module source wafer 40 comprising a sacrificial layer 50 comprising sacrificial portions 52 separated (e.g., laterally separated) by anchors 54, disposing a module substrate 10 exclusively on and directly over each sacrificial portion 52, disposing a component 20 on each module substrate 10, module substrate 10 being equally flexible or more flexible than component 20, and providing a module tether 12 connecting module substrate 10 to one of the anchors 54. Component 20 can comprise or be attached to component tether 22. Module substrate 10 can comprise an organic material. Module tether 12 can be more brittle than module substrate 10. Some methods comprise disposing encapsulation layer 30 over component 20 and component 20. Component 20 can be in a mechanically neutral stress plane of micro-component module 99. Some embodiments comprise etching sacrificial portions 52 to release micro-component modules 99 from module source wafer 40, leaving micro-component modules 99 each attached by one or more module tethers 12 to one or more anchors 54. Some embodiments comprise transfer printing released micro-component module 99 to a system substrate 70 (e.g., a target substrate) with a stamp 60. Some embodiments comprise etching sacrificial portions 52 to release micro-component modules 99 from module source wafer 40, leaving micro-component modules 99 completely separated from and unattached to module source wafer 40. In some embodiments, system substrate 70 is no less flexible or is more flexible than module substrate 10.

Figure 22A:
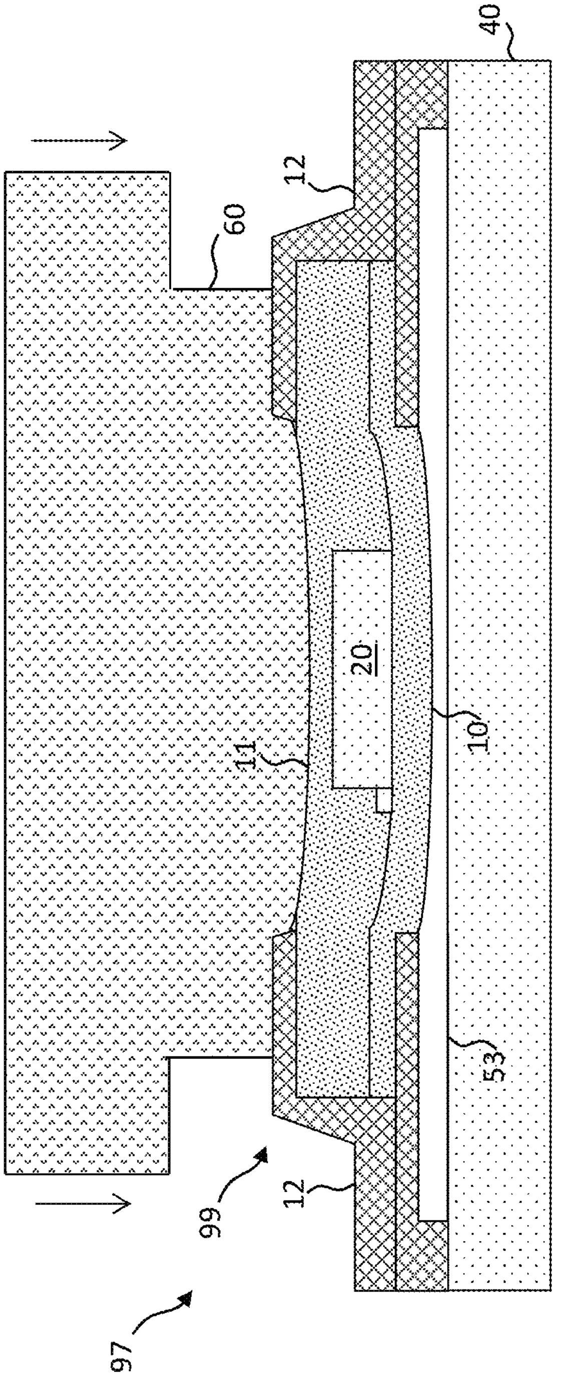
FIGS. 22A-22B are successive cross sections of structures enabling micro-transfer printing of a micro-component module according to illustrative embodiments of the present disclosure.
Figure 22B:
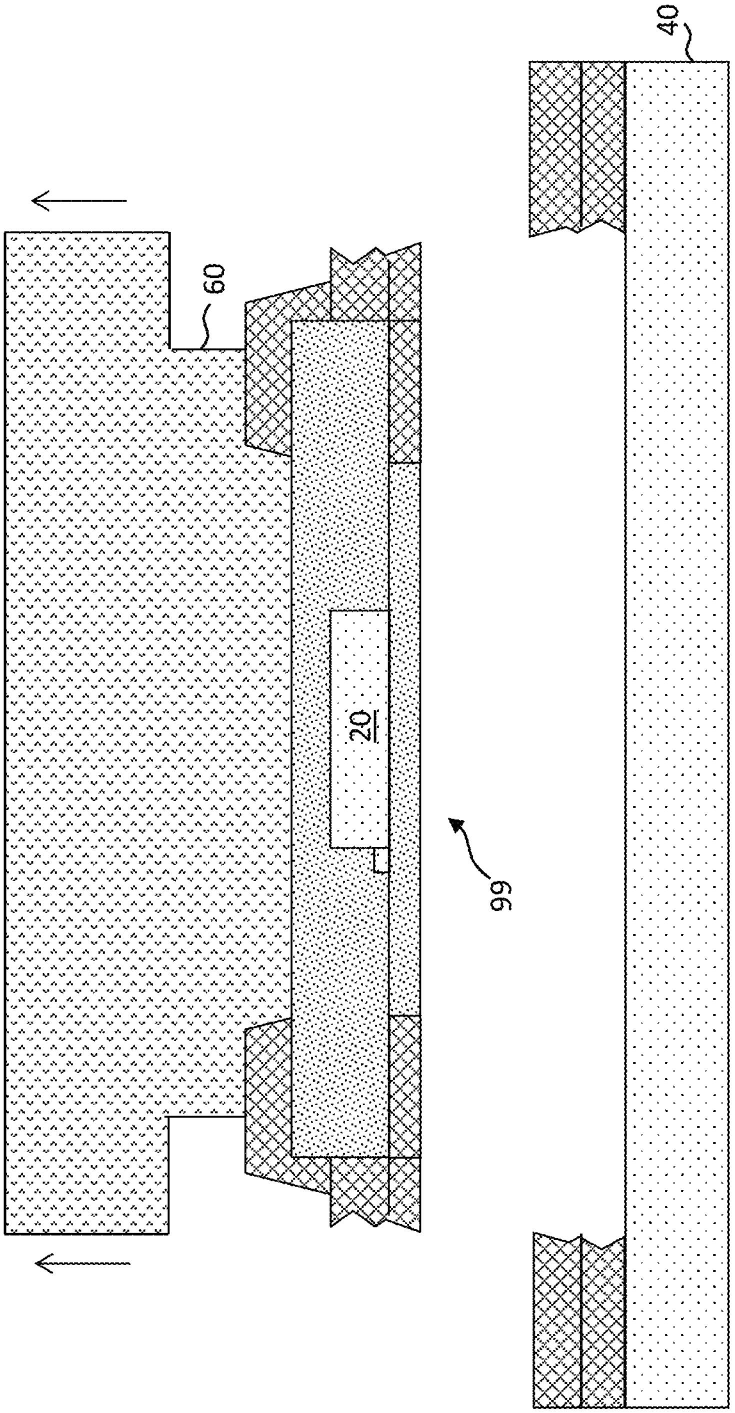

FIGS. 22A and 22B illustrate micro-transfer picking a micro-component module 99 from module source wafer 40. As shown in FIG. 22A, sacrificial portion 52 of module source wafer 40 (shown in FIG. 20) is etched to form gap 53 as in FIG. 21. A stamp 60, for example a soft and compliant stamp 60 (e.g., comprising an elastomer), contacts a top side of micro-component module 99 opposite gap 53 and adheres micro-component module 99 to stamp 60. Stamp 60 is removed from module source wafer 40 with micro-component module 99 adhered to stamp 60, as shown in FIG. 22B. Stamp 60 can then print removed micro-component module 99 to a destination substrate. The pressure of stamp 60 can cause flexible module substrate 10 to bend but, at least in part because of module tethers 12, physical and temporal contact and stiction between flexible module substrate 10 and module source wafer 40 is reduced or eliminated, improving the ability of stamp 60 to remove micro-component module 99 from module source wafer 40. Even if flexible module substrate 10 and module source wafer 40 come into contact during the stamp 60 picking process, the short contact time can be too brief and insufficiently intimate to counteract adhesion between stamp 60 and micro-component module 99. In contrast, a flexible module substrate 10 material such as a polyimide, e.g., without module tethers 12 according to embodiments of the present disclosure, that contacts module source wafer 40 for an extended length of time after sacrificial portion 52 is removed, can experience much stronger stiction to module source wafer 40. Module tethers 12 also reduce the area of any module substrate 10 contacting module source wafer 40 and provide multiple delamination fronts where module tethers 12 support module substrate 10 that aid in removing micro-component module 99 from module source wafer 40. Thus, methods of making a micro-component module 99 according to embodiments of the present disclosure can comprise providing a module source wafer 40, removing sacrificial portion 52, and removing micro-component module 99 from module source wafer 40 with stamp 60, thereby fracturing module tether 12.

Figure 23A:
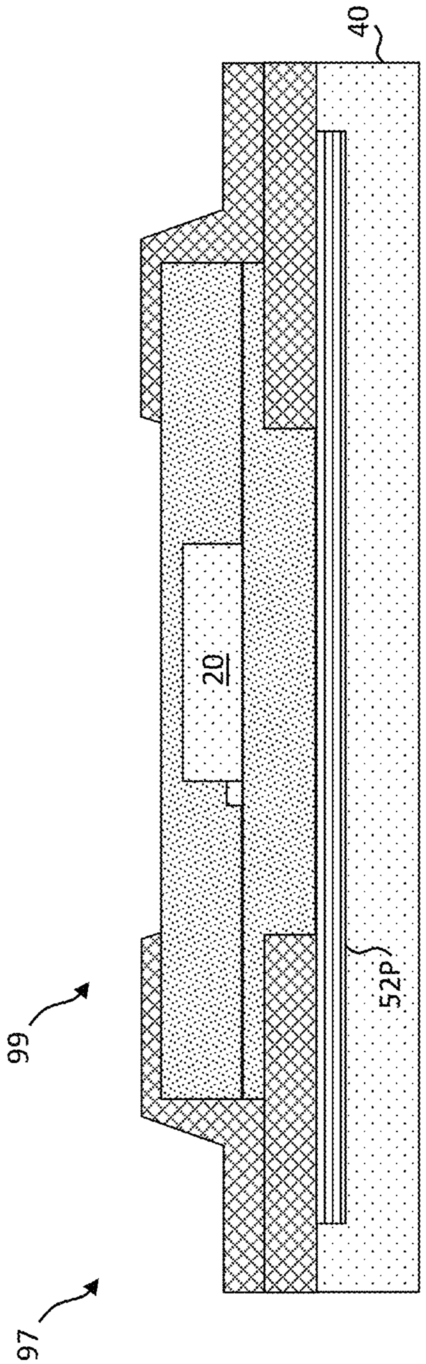
FIGS. 23A-23C are successive cross sections of micro-transfer printing a micro-component module by peeling the micro-component module from a low-adhesion surface according to illustrative embodiments of the present disclosure.
Figure 23B:
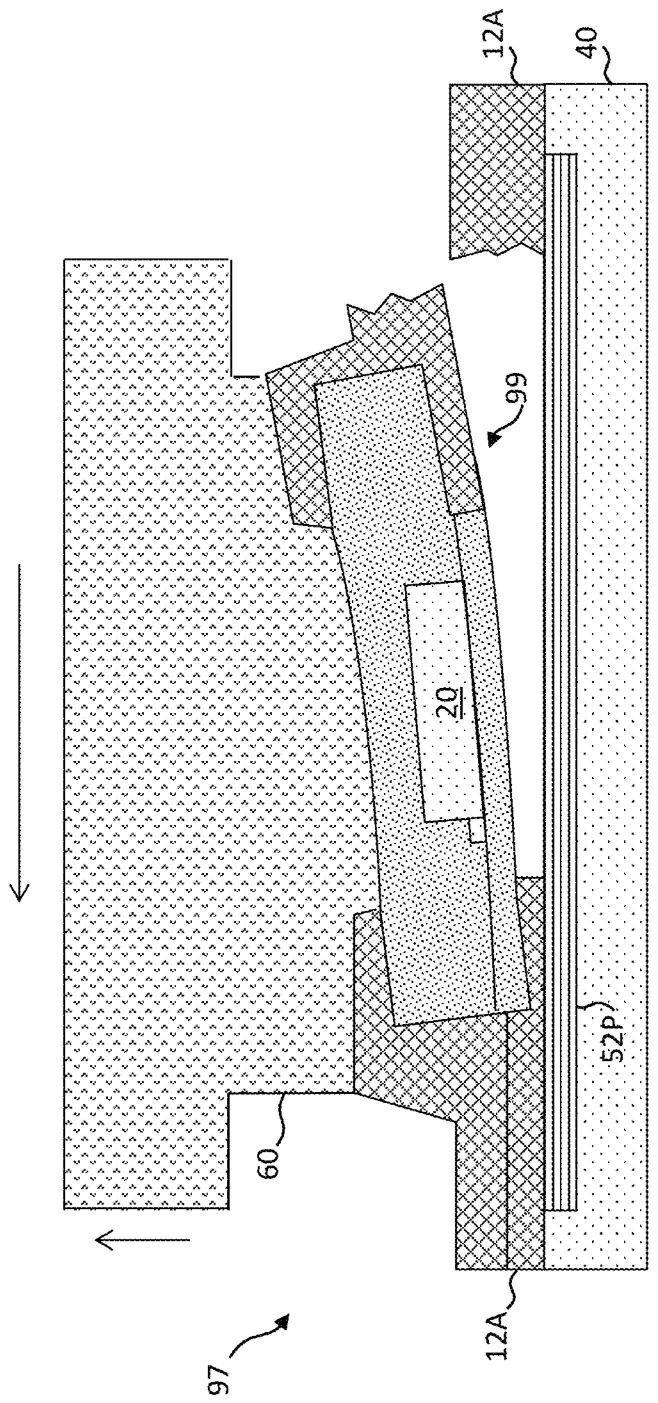
Figure 23C:
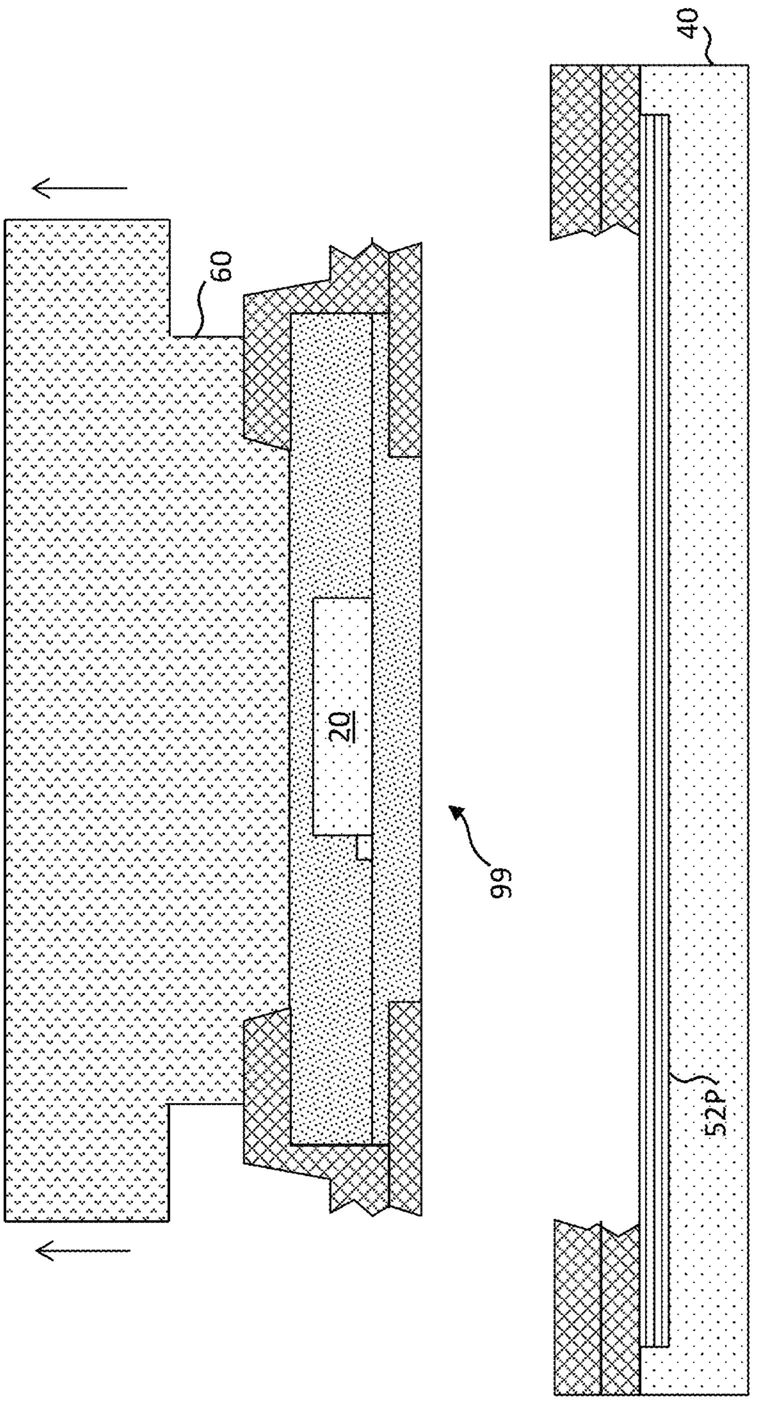
Figure 25:
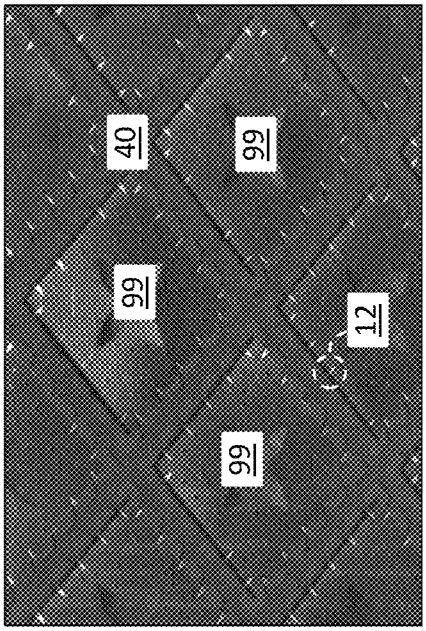
FIGS. 24-29 are micro-graphs of micro-component source wafers according to illustrative embodiments of the present disclosure.
Figure 26:
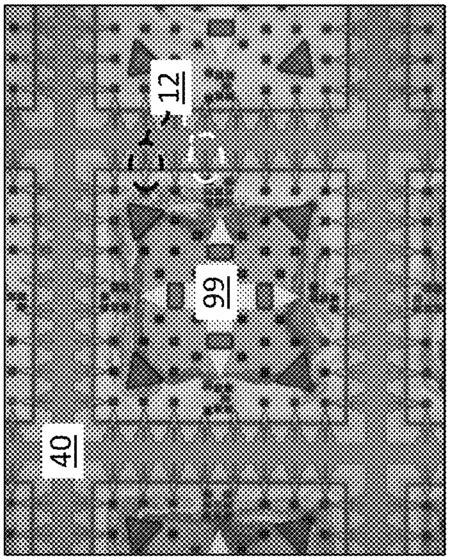
Figure 24:
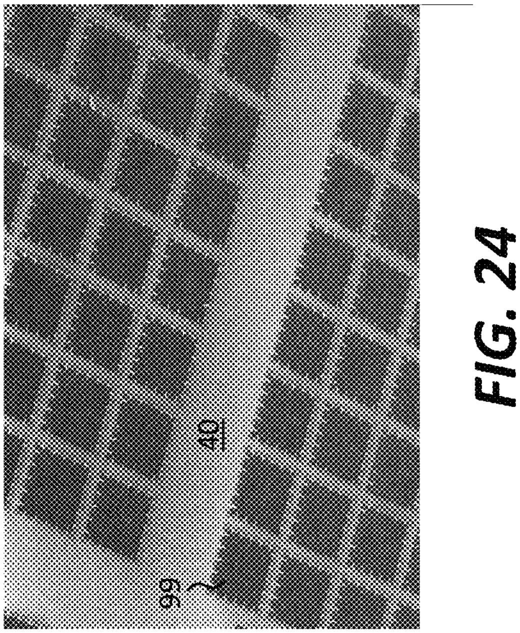
Figure 28:
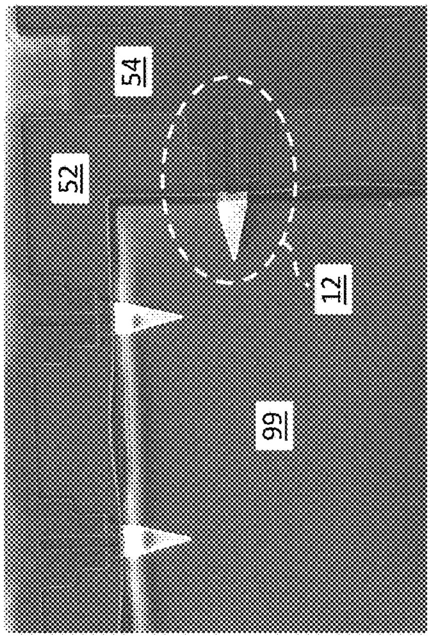
Figure 27:
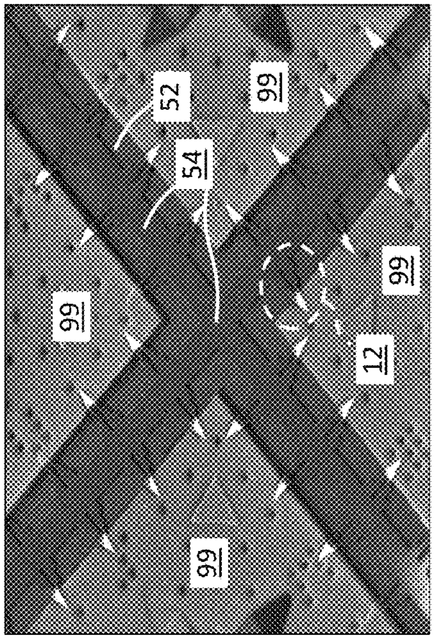
Figure 29:
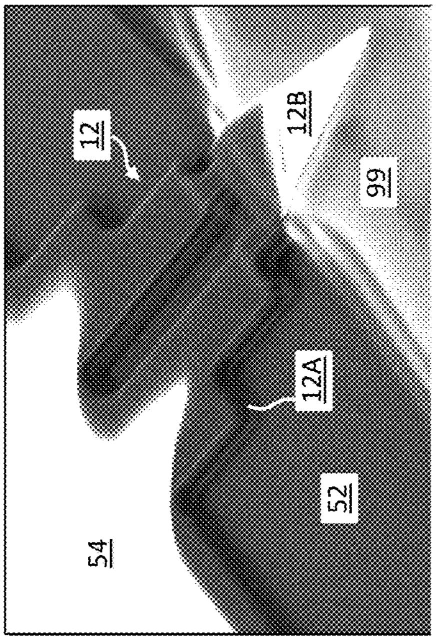

According to some embodiments of the present disclosure and as illustrated in FIGS. 23A-23C, sacrificial portion 52 comprises a low-adhesion surface on which module substrate 10 is at least partially disposed. In some embodiments, at least a portion of tether 12 is also at least partially disposed on the low-adhesion surface of sacrificial portion 52, for example as shown in FIG. 23A. In some such embodiments, because module substrate 10 is flexible (even if component 20 and module tether(s) 12 are not) module micro-component 99 can be peeled from sacrificial layer 50, bending module substrate 10 and breaking (e.g., fracturing) or separating module tether 12 from sacrificial portion 52 and anchors 54, as shown in FIG. 23B, for example by moving stamp 60 laterally (e.g., in a horizontal direction parallel to the surface of module source wafer 40) as well as vertically upwards away from module source wafer 40 to remove micro-component module 99 from module source wafer 40, as shown in FIG. 23C. Thus, methods of making a micro-component module 99 according to embodiments of the present disclosure can comprise providing a module source wafer 40 and removing micro-component module 99 from module source wafer 40 with stamp 60, thereby breaking (e.g., fracturing) module tether 12. Some methods comprise providing a module source wafer 40 that comprises (i) a peeling layer comprising peeling portions 52P laterally separated by anchors 54 disposed on module source wafer 40 or forming a layer of module source wafer 40 and (ii) a module substrate 10 and component 20 disposed directly on and entirely over each peeling portion 52P and removing micro-component module 99 from module source wafer 40 with stamp 60 by peeling module substrate 10 off of peeling portion 52P from a corner or an edge of module substrate 10.

Embodiments of the present disclosure have been constructed and micro-transfer printed. FIGS. 24-29 illustrate a module source wafer 40 with sacrificial portions 52, anchors 54, and micro-component modules 99 having module tethers 12 at different magnifications. In some demonstrations, module source wafer 40 comprises silicon on which sacrificial portions 52 comprising 500-1500 nm (e.g., 550 nm) of germanium deposited by evaporation with openings for anchors 54, are patterned, for example by plasma dry etching. Silicon dioxide first module tether layers 12A are deposited and patterned and first module substrate layers 10A comprising 1-1.5 microns thick polyimide are spin coated and patterned, (e.g., using PI2600 series from HDMicroSystems). Thicker polyimide formulations, multiple spin coats, or both can be used to increase module substrate layer thickness. Intermediate coats of polyimide can be used as a planarization layer and can also enable the formation of cavities or component wells to assist and facilitate subsequent heterogenous device integration. Components 20 (e.g., silicon integrated circuits from a silicon component source wafer) are deposited on module substrate 10 (e.g., into module cavities or module wells) by micro-transfer printing, optionally with a thin adhesive layer such as Intervia, followed by O2 plasma field etch after printing to remove exposed adhesive. A 4-micron thick second layer of a polyimide (e.g., module substrate layer 10C) is coated and patterned to planarize components 20, electrical connections between components 20 are formed on the planarization layer using photolithography, and a 1-1.5 micron thick third layer of polyimide is deposited to encapsulate components 20 (e.g., module substrate layer 10B), for example as shown in FIG. 17F. Five microns of silicon dioxide are deposited and patterned over third module substrate layer 10B to form second module tether layers 12B and form anchors 54. Sacrificial portions 52 can be etched with $H_2O_2$ and micro-component modules 99 can be picked up from module source wafer 40 with a PDMS stamp 60 or laminated against thin adhesive films and removed. FIGS. 24-29 correspond, for example, to the structures and methods illustrated in FIG. 17F and FIGS. 20-22B.

Embodiments of the present disclosure are operable by providing power to interconnections 40 connected to components 20 and thereby energizing components 20 to perform a desired function. In some embodiments, module structures 16 absorb or transmute power (e.g., electromagnetic, mechanical, or electrical or magnetic field power) and provide the power to interconnections 40 to energize components 20. In some embodiments, micro-component module system 98 is mechanically perturbed or stressed without functionally damaging micro-component module 99 or micro-component module system 98.

According to embodiments of the present disclosure, sacrificial portions 52 comprise a sacrificial material that is an anisotropically etchable material, the sacrificial material is a same material as a material of module source wafer 40, or sacrificial portions 52 comprise a sacrificial material that is a different material that is differentially etchable from a material of module source wafer 40 and module substrate 10. According to some embodiments, sacrificial material of sacrificial portions 52 comprises germanium. According to some embodiments module source wafer 40 comprises silicon, e.g., crystalline silicon, glass, polymer, ceramic, sapphire, quartz, or metal.

Micro-transfer printing enables the heterogeneous micro-assembly of components 20 (components 20 such as electrical, optical, acousto-optic, and electro-optic components and integrated circuits, for example compound semiconductor micro-lasers, silicon control circuits, and piezo-electric devices and electrically active or passive devices) into a common electronic, optical, acousto-optic, or electro-optic system, for example on a common system substrate 70 in an electronic, photonic, or radio frequency integrated system. In some embodiments, micro-components 20 are formed as coupons on sacrificial portions 52 laterally separated by anchors 54 disposed in a sacrificial layer 50 of a native component 20 source substrate and can be micro-transfer printed from the native component 20 source substrate with a stamp (e.g., comprising a visco-elastic elastomer such as PDMS) using methods similar to those for micro-assembling micro-component modules 99 onto system substrates 70 so that micro-components 20 can comprise broken (e.g., fractured) or separated component tethers 22. This process can be performed multiple times with different components 20 from different native component 20 source substrates (wafers) to form a heterogeneous micro-assembly on module substrate 10. Micro-components 20 can be disposed in desired spatial positions on module substrate 10 and electrically (or optically) connected using conventional photolithographic methods and materials, e.g., with patterned dielectric structures 38 and electrically conducting wires or light pipes such as interconnections 14. For example, a compound semiconductor micro-laser, a light-emitting diode, or an optical micro-sensor can be printed on a module substrate 10 in close spatial proximity to a light-pipe or other optical micro-component and electrically connected to control circuits disposed in a silicon integrated circuit all micro-assembled on a common module substrate 10. Similarly, a plurality of micro-component modules 99 can be assembled on system substrate 70 with a variety of different micro-component modules 99 comprising different materials, circuits, and functionalities to form a system.

A module source wafer 40 or substrate can be any of a wide variety of relatively flat, stable materials suitable for photolithographic or integrated circuit processing, for example glass, plastic, a crystalline semiconductor such as silicon, a compound semiconductor that comprises materials such as indium phosphide, gallium nitride or gallium arsenide, quartz, or sapphire, or any suitable substrate or wafer material.

Components 20 can be any useful structure that can be printed (e.g., micro-transfer printed) as part of printable micro-component module 10. Component 20 can comprise any material or structure useful for the intended purpose of components 20. Components 20 can be electronic, mechanical, optical, or electro-optical structures, can be passive or active, or can be integrated circuits, electronic devices, optical devices, or optoelectronic devices. It is contemplated that there is no inherent limit to the type, function, or materials of components 20. Components 20 can be integrated circuits, lasers, light-emitting diodes, optical sensors, or light pipes, for example, or other light emitting, sensing, or controlling devices. In some embodiments, components 20 are electronic, optoelectronic, optical, processing, electromechanical, or piezoelectric devices. Components 20 can be micro-components, for example having a length or width, or both length and width less than 1 mm, no greater than 500 microns, no greater than 200 microns, no greater than 100 microns, no greater than 50 microns, no greater than 20 microns, or no greater than 10 microns. Components 20 can be micro-components with a thickness no greater than 5 microns, 10 microns, 20 microns, 50 microns, or 100 microns.

U.S. Pat. No. 7,799,699 describes methods of making micro-transfer-printable inorganic components 20, the disclosure of which is hereby incorporated by reference. Structures and elements in accordance with certain embodiments of the present disclosure can be made and assembled using micro-transfer printing methods and materials. For a discussion of micro-transfer printing techniques applicable to (e.g., adaptable to or combinable with) methods disclosed herein see U.S. Pat. Nos. 8,722,458, 7,622,367 and 8,506,867, the disclosure of each of which is hereby incorporated by reference. Methods of forming micro-transfer printable structures are described, for example, in the paper *AMOLED Displays using Transfer-Printed Integrated Circuits* (Journal of the Society for Information Display, 2011, DOI #10.1889/JSID19.4.335, 1071-0922/11/1904-0335, pages 335-341) and U.S. Pat. No. 8,889,485. Micro-transfer printing using compound micro-assembly structures and methods can also be used with certain embodiments of the present disclosure, for example, as described in U.S. patent application Ser. No. 14/822,868, filed Aug. 10, 2015, entitled Compound Micro-Assembly Strategies and Devices, the disclosure of which is hereby incorporated by reference in its entirety. Additional details useful in understanding and performing certain embodiments of the present disclosure are described in U.S. patent application Ser. No. 14/743,981, filed Jun. 18, 2015, entitled Micro Assembled LED Displays and Lighting Elements, the disclosure of which is hereby incorporated by reference in its entirety.

As is understood by those skilled in the art, the terms "over", "under", "above", "below", "beneath", and "on" are relative terms and can be interchanged in reference to different orientations of the layers, elements, and substrates included in the present disclosure. For example, a first layer on a second layer, in some embodiments means a first layer directly on and in contact with a second layer. In other embodiments, a first layer on a second layer can include another layer there between.

Throughout the description, where apparatus and systems are described as having, including, or comprising specific components, device, or elements, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as operability is maintained. Moreover, two or more steps or actions in some circumstances can be conducted simultaneously.

Having described certain embodiments, it will now become apparent to one of skill in the art that other embodiments incorporating the concepts of the disclosure may be used. Therefore, the claimed invention should not be limited to the described embodiments, but rather should be limited only by the spirit and scope of the following claims.

PARTS LIST

A cross section
10 module substrate
10A module substrate layer/organic module substrate layer
10B module substrate layer/inorganic module substrate layer
10C module substrate layer
10M module substrate bottom side
10T module substrate top side
11 encapsulation layer
12 module tether
12A module tether layer
12B module tether layer
12F module tether fracture area
13 internal module tether
14 interconnection
14C component interconnection
14M module interconnection
15 internal module cavity
16 module structure
18 spike
19 anti-stiction structure
20 component
22 component tether
24 component contact pad
30 encapsulation layer
30A organic encapsulation layer
30B inorganic encapsulation layer
30L lower encapsulation sublayer
30U upper encapsulation sublayer
32 neutral mechanical stress plane
34 interconnection via
36 electrode
38 dielectric structure
40 module source wafer
42 form
44 opening
50 sacrificial layer
52 sacrificial portion
52P peeling portion
53 gap
54 anchor
55 internal anchor
60 stamp
70 system substrate
97 micro-component module source wafer
98 micro-component module system
99 micro-component module
100 provide module source substrate step
105 dispose sacrificial layer step
110 optional pattern sacrificial layer step
115 dispose module substrate step
120 optional pattern module interconnections step
125 optional pattern module substrate step
130 provide component source substrate step
135 micro-transfer print component step
140 dispose lower encapsulation layer step
145 optional pattern component interconnections step
150 dispose upper encapsulation layer step
155 pattern encapsulation layers step
160 dispose tethers step
165 etch sacrificial portions step
170 provide system substrate step
175 micro-transfer print modules step

What is claimed:

1. A micro-component module, comprising:

a module substrate having a top side and an opposing bottom side, wherein the module substrate is flexible and comprises an organic material or polymer;

a component disposed on the top side of the module substrate; and a module tether, wherein the module tether extends (i) beyond the module substrate and (ii) directly beneath only a portion of the bottom side of the module substrate and within only a portion of the module substrate, and wherein the module tether comprises a breakable or broken portion and comprises an organic material or amorphous material.

2. The micro-component module of claim 1, wherein the module tether extends beneath only a portion of the bottom side of the module substrate.

3. The micro-component module of claim 1, wherein the module tether extends within only a portion of the module substrate.

4. The micro-component module of claim 1, wherein the module tether further extends on only a portion of the top side of the module substrate.

5. The micro-component module of claim 1, wherein the module tether is more rigid than the module substrate.

6. The micro-component module of claim 1, wherein the module substrate is organic and the module tether is inorganic.

7. The micro-component module of claim 6, wherein (i) the module substrate is polyimide, (ii) the module tether is an oxide or a nitride, or (iii) both (i) and (ii).

8. The micro-component module of claim 7, wherein the module tether is made of silicon dioxide or silicon nitride.

9. The micro-component module of claim 1, wherein the module tether is broken.

10. The micro-component module of claim 1, further comprising a second module tether wherein the second module tether extends (i) beyond the module substrate and (ii) directly beneath only a portion of the bottom side of the module substrate, within only a portion of the module substrate, or both.

11. The micro-component module of claim 1, comprising an encapsulation layer disposed on the module substrate and the component and wherein the module tether extends directly over only a portion of the encapsulation layer.

12. The micro-component module of claim 11, wherein the encapsulation layer comprises a same material as the module substrate.

13. The micro-component module of claim 1, comprising an encapsulation layer disposed on the module substrate and the component and wherein the encapsulation layer extends directly over only a portion of the module tether.

14. A micro-component module source wafer, comprising:

a wafer; and the micro-component module of claim 1, wherein the micro-component module is suspended over the wafer by the module tether defining a gap between the micro-component module and the wafer.

15. The micro-component module source wafer of claim 14, wherein the module substrate is curved and is not in contact with the wafer other than by the module tether.

16. A method of making a micro-component module, comprising:

providing a micro-component module source wafer according to claim 14; and removing the micro-component module from the wafer with a stamp, thereby breaking the module tether.

17. A micro-component module source wafer, comprising:

a wafer;

a sacrificial layer comprising sacrificial portions laterally separated by anchors disposed on the wafer or forming a layer of the wafer; and a micro-component module according to claim 1 disposed directly on and entirely over each of the sacrificial portions such that the module tether is connected to one of the anchors.

18. The micro-component module source wafer of claim 17, wherein each of the sacrificial portions comprise a low-adhesion surface on which the micro-component module is at least partially disposed.

19. A method of making a micro-component module, comprising:

providing a micro-component module source wafer, the micro-component module source wafer comprising: (i) a peeling layer comprising peeling portions laterally separated by anchors disposed on the wafer or forming a layer of the wafer and (ii) a respective micro-component module according to claim 1 disposed directly on and entirely over each of the peeling portions, wherein the module tether of the micro-component module is connected to one of the anchors; and removing the respective micro-component module from the wafer with a stamp by peeling the module substrate of the micro-component module off of the peeling portion from a corner or edge of the module substrate of the micro-component module.

20. The method of claim 19, wherein removing the micro-component module from the wafer with the stamp comprises moving the stamp laterally in a direction away from the corner or edge.

21. A micro-component module, comprising:

a module substrate having a top side and an opposing bottom side, wherein the module substrate is flexible and comprises an organic material or polymer;

a component disposed on the top side of the module substrate; and a module tether, wherein the module tether extends (i) beyond the module substrate and (ii) directly beneath only a portion of the bottom side of the module substrate, and wherein the module tether comprises a breakable or broken portion and comprises an organic material or amorphous material.

* * * * *